United States Patent
Lowes et al.

(10) Patent No.: US 9,048,396 B2
(45) Date of Patent: Jun. 2, 2015

(54) LED PACKAGE WITH ENCAPSULANT HAVING PLANAR SURFACES

(71) Applicant: CREE, INC., Durham, NC (US)

(72) Inventors: Theodore Lowes, Lompoc, CA (US); Eric J. Tarsa, Goleta, CA (US); Sten Heikman, Goleta, CA (US); Bernd Keller, Santa Barbara, CA (US); Jesse Reiherzer, Raleigh, NC (US); Hormoz Benjamin, Moorpark, CA (US)

(73) Assignee: Cree, Inc., Durham, NC (US)

( * ) Notice: Subject to any disclaimer, the term of this patent is extended or adjusted under 35 U.S.C. 154(b) by 94 days.

(21) Appl. No.: 13/649,052

(22) Filed: Oct. 10, 2012

(65) Prior Publication Data
US 2013/0329425 A1     Dec. 12, 2013

Related U.S. Application Data

(60) Provisional application No. 61/658,271, filed on Jun. 11, 2012, provisional application No. 61/660,231, filed on Jun. 15, 2012, provisional application No. 61/696,205, filed on Sep. 2, 2012.

(51) Int. Cl.
*F21V 9/16* (2006.01)
*H01L 33/50* (2010.01)
(Continued)

(52) U.S. Cl.
CPC ............. *H01L 33/502* (2013.01); *H01L 33/54* (2013.01); *F21V 9/00* (2013.01); *H01L 33/505* (2013.01);
(Continued)

(58) Field of Classification Search
USPC ................ 362/231, 311.02, 311.03, 84; 257/E21.85, 676; 438/25, 26, 106
See application file for complete search history.

(56) References Cited

U.S. PATENT DOCUMENTS

| 4,013,916 A | 3/1977 | Brown |
| 6,350,041 B1 | 2/2002 | Tarsa et al. |

(Continued)

FOREIGN PATENT DOCUMENTS

| CN | 1380703 | 11/2002 |
| CN | 1776506 | 5/2006 |

(Continued)

OTHER PUBLICATIONS

U.S. Appl. No. 11/656,759, filed Jan. 22, 2007, Chitnis, et al.
(Continued)

*Primary Examiner* — Ali Alavi
(74) *Attorney, Agent, or Firm* — Koppel, Patrick, Heybl & Philpott

(57) ABSTRACT

LED packages are disclosed that are compact and efficiently emit light, and can comprise encapsulants with planar surfaces that refract and/or reflect light within the package encapsulant. The packages can comprise a submount with one or more LEDs, and a blanket conversion material layer on the LEDs and the submount. The encapsulant can be on the submount, over the LEDs, and light reflected within the encapsulant will reach the conversion material, where it is absorbed and emitted omnidirectionally. Reflected light can now escape the encapsulant, allowing for efficient emission and a broader emission profile, when compared to conventional packages with hemispheric encapsulants or lenses. In certain embodiments, the LED package provides a higher chip area to LED package area ratio. By using an encapsulant with planar surfaces, the LED package can provide unique dimensional relationships between the various features and the LED package ratios, enabling more flexibility with different applications.

91 Claims, 15 Drawing Sheets

(51) Int. Cl.
*H01L 33/54* (2010.01)
*F21V 9/00* (2006.01)

(52) U.S. Cl.
CPC ............ *H01L 2924/0002* (2013.01); *H01L 2224/48091* (2013.01); *H01L 2224/48247* (2013.01); *H01L 2224/73265* (2013.01)

(56) References Cited

U.S. PATENT DOCUMENTS

| | | | |
|---|---|---|---|
| 6,521,915 B2 * | 2/2003 | Odaki et al. | 257/98 |
| 6,686,676 B2 * | 2/2004 | McNulty et al. | 313/112 |
| 7,009,343 B2 * | 3/2006 | Lim et al. | 315/150 |
| 7,213,940 B1 | 5/2007 | Van de Ven et al. | |
| 7,253,448 B2 | 8/2007 | Roberts et al. | |
| 7,614,759 B2 | 11/2009 | Negley | |
| 7,762,692 B2 | 7/2010 | Lai et al. | |
| 8,450,147 B2 * | 5/2013 | Chandra | 438/106 |
| 2002/0163302 A1 | 11/2002 | Nitta et al. | |
| 2003/0008431 A1 | 1/2003 | Matsubara et al. | |
| 2004/0130880 A1 | 7/2004 | Min et al. | |
| 2004/0217364 A1 * | 11/2004 | Tarsa et al. | 257/89 |
| 2004/0218390 A1 | 11/2004 | Holman et al. | 362/245 |
| 2005/0073840 A1 | 4/2005 | Chou et al. | |
| 2005/0173708 A1 | 8/2005 | Suehiro et al. | |
| 2006/0049421 A1 | 3/2006 | Suehiro et al. | |
| 2006/0060882 A1 | 3/2006 | Ohe et al. | |
| 2006/0124946 A1 | 6/2006 | Fujita | |
| 2006/0186431 A1 | 8/2006 | Miki et al. | |
| 2006/0273337 A1 | 12/2006 | Han et al. | |
| 2006/0278886 A1 | 12/2006 | Tomoda et al. | |
| 2007/0108463 A1 | 5/2007 | Chua et al. | |
| 2009/0050907 A1 * | 2/2009 | Yuan et al. | 257/88 |
| 2009/0057699 A1 | 3/2009 | Basin et al. | |
| 2009/0091045 A1 | 4/2009 | Tanikawa et al. | 257/791 |
| 2009/0140272 A1 * | 6/2009 | Beeson et al. | 257/89 |
| 2009/0173958 A1 * | 7/2009 | Chakraborty et al. | 257/98 |
| 2009/0272995 A1 | 11/2009 | Ito et al. | |
| 2010/0155763 A1 | 6/2010 | Donofrio et al. | |
| 2010/0252851 A1 * | 10/2010 | Emerson et al. | 257/98 |
| 2011/0031527 A1 | 2/2011 | Kotani et al. | |
| 2011/0121331 A1 | 5/2011 | Simonian et al. | 257/98 |
| 2011/0140289 A1 | 6/2011 | Shiobara et al. | 257/789 |
| 2011/0156061 A1 | 6/2011 | Wang et al. | |
| 2011/0220920 A1 * | 9/2011 | Collins et al. | 257/88 |
| 2011/0221330 A1 | 9/2011 | Negley et al. | |
| 2011/0291131 A1 | 12/2011 | Ito | |
| 2011/0316006 A1 | 12/2011 | Xu | |
| 2012/0061703 A1 | 3/2012 | Kobayashi | |
| 2012/0062821 A1 | 3/2012 | Takeuchi et al. | |
| 2012/0068198 A1 | 3/2012 | Andrews et al. | 257/88 |

FOREIGN PATENT DOCUMENTS

| | | |
|---|---|---|
| CN | 1802756 | 7/2006 |
| EP | 0441622 A1 | 2/1991 |
| EP | 1529807 A2 | 5/2005 |
| EP | 2042528 A1 | 9/2007 |
| EP | 2113949 A2 | 11/2009 |
| EP | 2196501 A1 | 12/2009 |
| EP | 2149920 A1 | 2/2010 |
| EP | 2336230 A1 | 6/2011 |
| JP | 2001301230 | 10/2001 |
| JP | 2006165029 | 6/2006 |
| KR | 100809658 | 3/2008 |
| WO | 2006059828 | 6/2006 |
| WO | WO2006060141 A2 | 6/2006 |
| WO | WO2011061650 A1 | 5/2011 |

OTHER PUBLICATIONS

U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 12/463,709, filed May 11, 2009, Donofrio.
U.S. Appl. No. 13/034,501, filed Feb. 24, 2011, Le, et al.
U.S. Appl. No. 13/028,946, filed Feb. 16, 2011, Le, et al.
U.S. Appl. No. 13/368,217, filed Feb. 7, 2012, Pickard, et al.
U.S. Appl. No. 12/873,303, filed Aug. 31, 2010, Edmond, et al.
Cree@ family of LED chips. DA. EZ. GaN. MB. RT. TR. UT. and XT, printout from cree.com, 2 pages.
Bergquist Co., Chanhassen. Minn., "T-Clad" overview product sheet. 3 pages.
Cree@ XLampC family product info printout, from cree.com. 20 pages.
Creel@ XLampXM product info printout, from cree.com, 13 pages.
Cree@ XLampMC product info printout. from cree.com, 14 pges.
Citizen Micro HumanTech. "COB-High-wattage Series & Low-wattage Series", Short Form Lighting LED Catalog 2012, Citizen Electronics Co., Ltd. Japan, 7 pages.
Office Action from U.S. Appl. No. 13/040,088, dated May 7, 2013.
Response to OA from U.S. Appl. No. 13/040,088, filed Jun. 20, 2013.
Office Action from U.S. Appl. No. 13/051,894, Jan. 14, 2013.
Response to OA from U.S. Appl. No. 13/051,894, filed May 6, 2013.
International Search Report from PCT/US2013/044277, dated Jan. 7, 2014.
First Office Action from Chinese Patent Appl. No. 201210031021.0, dated Dec. 30, 2013.
International Preliminary Report on Patentability from PCT/US2012/028327, dated Oct. 3, 2013.
International Search Report for PCT Patent Application No. PCT/US2012/028327, dated Nov. 23, 2012.
Second Office Action from Chinese Patent Appl. No. 201210031021.0, dated Jun. 4, 2014.
International Search Report and Written Opinion from PCT/US2013/062640, dated May 22, 2014.
Office Action from U.S. Appl. No. 13/051,894, dated Jun. 18, 2014.
Office Action from U.S. Appl. No. 13/649,067, dated Jul. 7, 2014.
International Search Report and Written Opinion from Appl. No. PCT/US2014/045888, dated Sep. 19, 2014.
Office Action from U.S. Appl. No. 13/770,389, dated Sep. 15, 2014.
Notice of Acceptance for Invalidation from Chinese Appl. No. 200710148327.3, dated Jan. 27. 2015 and Chinese version.
International Preliminary Report and Written Opinion from Appl. No. PCT/US2013/044277, dated Dec. 24. 2014.

* cited by examiner

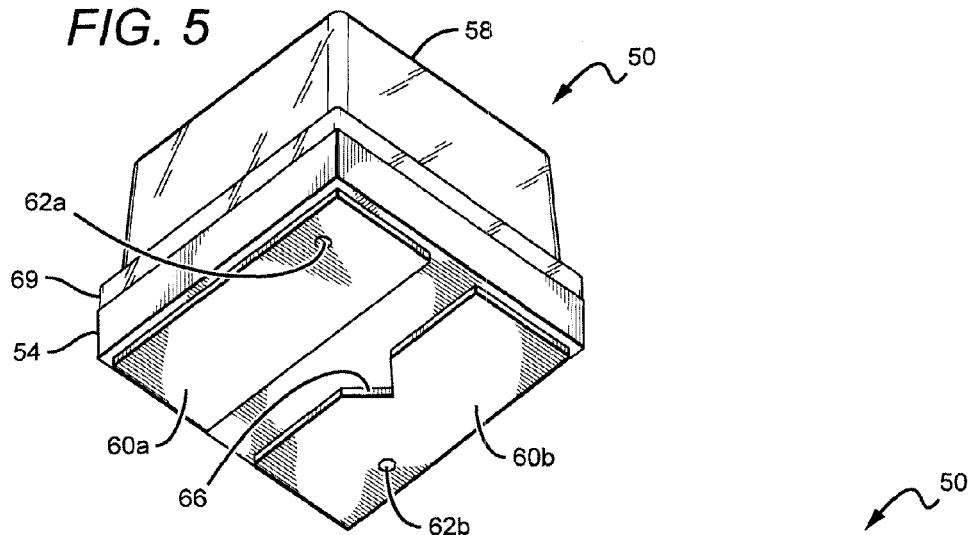
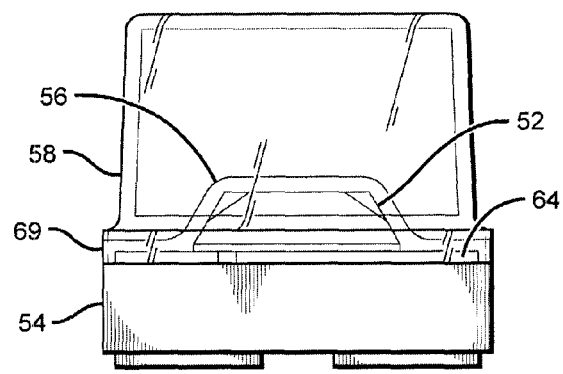
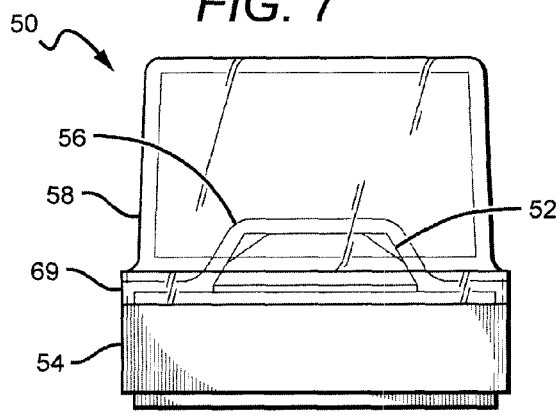

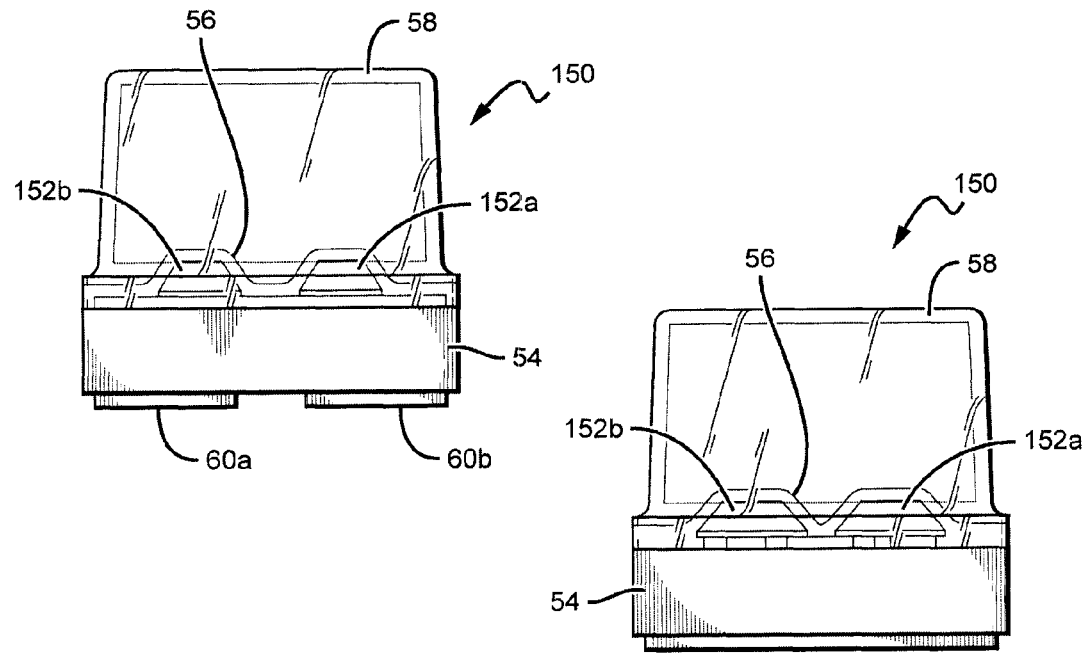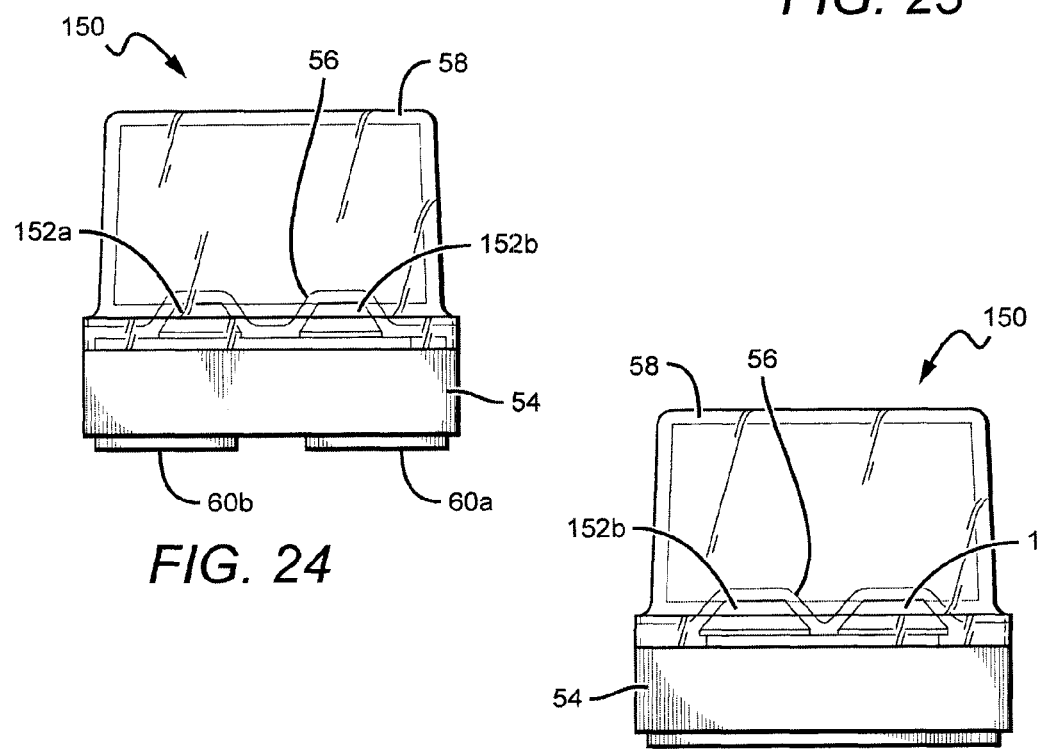

US 9,048,396 B2

LED PACKAGE WITH ENCAPSULANT HAVING PLANAR SURFACES

This application claims the benefit of U.S. Provisional Patent Application Ser. No. 61/658,271, filed on Jun. 11, 2012, U.S. Provisional Patent Application Ser. No. 61/660,231, filed on Jun. 15, 2012, and U.S. Provisional Patent Application Ser. No. 61/696,205, filed on Sep. 2, 2012.

BACKGROUND OF THE INVENTION

1. Field of the Invention

This invention pertains to solid state light emitters and in particular to light emitting diode (LED) packages that are capable of producing high efficiency light emission with a wider emission pattern from a device with smaller footprint.

2. Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that reaches the surface of the lens 36 is maximized to maximize the amount of light that emits from the lens 36 on the first pass. This can result in relatively large devices where the distance from the LED to the edge of the lens is maximized, and the edge of the submount can extend out beyond the edge of the encapsulant. Further, these devices generally produce a lambertIan emission pattern that is not always ideal for wide emission area applications. In some conventional packages the emission profile can be approximately 120 degrees full width at half maximum (FWHM).

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

SUMMARY OF THE INVENTION

The present invention is generally directed to LED packages that are compact and efficiently emit light, and can comprise encapsulants with planar surfaces that refract and/or reflect light within the package encapsulant. The packages can also comprise a submount with one or more LEDs, and a blanket conversion material layer on one or more LEDs. The blanket conversion material may also cover at least part of the submount. The encapsulant can be on the submount, over the LEDs, and over at least part of the blanket conversion material. Some of the light reflected within the encapsulant, due, for example, to total internal reflection from planar or otherwise shaped encapsulant surface, will reach the conversion material, where it may be scattered or absorbed and converted and then emitted omnidirectionally. This allows for reflected light to now escape from the encapsulant. This allows for efficient emission and a broader emission profile, for example when compared to conventional packages with hemispheric encapsulants or lenses. In certain embodiments, the LED package provides a higher chip area to LED package area ratio. By using an encapsulant with planar surfaces, the LED package can provide unique dimensional relationships between the various package features, enabling more flexibility in using the packages in different applications, for example linear LED lights for replacing linear fluorescent lights. The unique dimensional relationships can include: encapsulant height, width and distance to the edge of the LED chip(s), distance between LED chips in a multiple chip embodiment, LED epitaxial area verses package area, broader emission pattern per package footprint, more light output power per package footprint, improved mixing or blending or uniformity of different colors emitted by the package.

Some LED package embodiments according to the present invention can comprise an LED light source on a submount and a conversion material layer covering the LED light source and the top surface of the submount. The package can further comprise an encapsulant over the conversion material layer, with the encapsulant having one or more planar surfaces.

Other embodiments of LED packages according to the present invention comprise an LED light source on a submount. An encapsulant is included on the submount, with the encapsulant having one or more planar surfaces. The LED package can emit an emission profile that is wider than a similar package with an encapsulant not having planar surfaces.

Other embodiments of LED packages according to the present invention comprise an LED light source on a submount. An encapsulant is included on the submount, with the encapsulant having one or more planar surfaces, and wherein the submount has a footprint area of less than 12 mm square.

Other embodiments of LED packages according to the present invention comprise one or more LEDs on a submount. An encapsulant is included on the submount, with the encapsulant having one or more planar surfaces. The LED packages can also have a ratio of the footprint of its one or more LEDs to the footprint of its submount that is in the range of just over 1 to approximately 20.

Still other embodiments of LED packages according to the present invention comprise one or more LEDs on a submount. A transparent encapsulant on the submount, with the encapsulant having one or more planar surfaces. The LED packages can also have a submount with a footprint ratio of approximately 1 by 1, with a corresponding package height ratio in the range of approximately 0.5 to 5.

Some embodiments of solid state luminaires according to the present invention can comprise a solid state light source with one or more light emitting diode (LED) packages. The one or more LED packages can comprise an LED light source on a submount and a blanket conversion material layer on the submount. An encapsulant can be included over the conversion material layer, with the encapsulant having one or more planar surfaces.

These and other aspects and advantages of the invention will become apparent from the following detailed description and the accompanying drawings which illustrate by way of example the features of the invention.

BRIEF DESCRIPTION OF THE DRAWINGS

FIG. 5 is a bottom perspective view the LED package shown in FIG. 4;

FIG. 6 is a side elevation view of the LED package shown in FIG. 4;

FIG. 7 is another side elevation view of the LED package shown in FIG. 4;

FIGS. 22 through 25 are side elevation views of the LED package shown in FIG. 20;

DETAILED DESCRIPTION OF THE INVENTION

Figure 1:
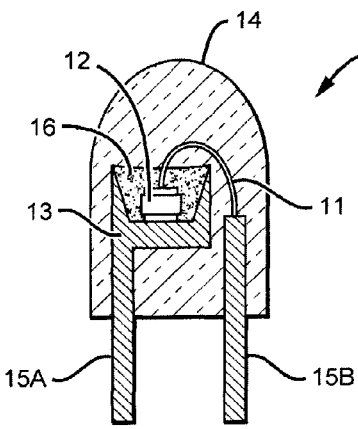
FIG. 1 shows a sectional view of one embodiment of a prior art LED lamp.
Figure 2:
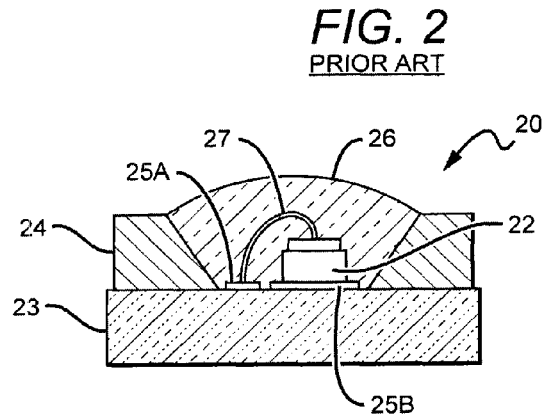
FIG. 2 shows a sectional view of another embodiment of a prior art LED package.
Figure 3:
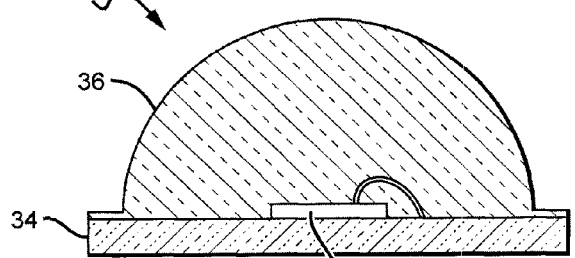
FIG. 3 shows a sectional view of still another embodiment of a prior art LED package.
Figure 4:
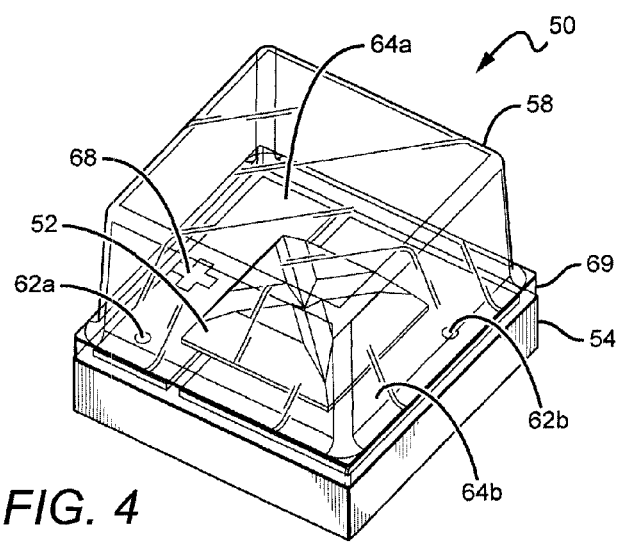
FIG. 4 is a top perspective view of one embodiment of an LED package according to the present invention.

The present invention is directed to different embodiments of LED package structures that are relatively small, while at the same time are efficient, reliable and cost effective. The packages according to the present invention can provide these improvements by having conversion material and encapsulants that are arranged and shaped to capitalize on the total internal reflection (TIR) of light within the package. That is, light incident on the package encapsulant at angles greater than the critical angle for TIR can be reflected back towards a conversion material within the package such that the light is converted or "recycled". This recycled light is scattered or converted and re-emitted from the conversion material omnidirectionally, such that some of the converted light will be redirected and will reach the surface of the encapsulant at an angle less than the critical angle and emit from the package. By arranging the LED packages to provide this photon recycling of reflected light, such as totally internally reflected (TIR) light, the LED packages can be provided with different encapsulant shapes and sizes that are closer to that of the package light source and the edge of the light source can be closer to the edge of the encapsulant. The LED packages can have planar surfaces that result in a certain amount of TIR light within the encapsulant. This provides increased flexibility in the different shapes that can be used beyond conventional hemispheric lenses that are typically arranged to minimize TIR light and can allow for more compact LED packages.

Some package embodiments according to the present invention can comprise LED packages with encapsulants having multiple planar surfaces, with at least some of the planar surfaces arranged to enhance TIR. Light from the package's LED light source can be less likely to reach the planar surface at angles less than the critical angle and can experience TIR. The planar surfaces can be relatively smooth such that light reaching the surfaces outside the critical angle experience TIR, without being redirected or scattered by features such as texturing or shaping. The LED light source as well as the surrounding substrate and conductive traces can be covered by a layer of conversion material. TIR light can be reflected back toward the LED and substrate, and in conventional packages where the substrate comprises an absorbing surface the light can be absorbed. By blanketing the LED and the surrounding surfaces with a converting material, the TIR light can be scattered or converted and recycled to emit from the LED package before it reaches the absorbing surfaces, thereby improving package efficiency.

Some embodiments can comprise one or more LEDs ("LED") on a submount with contacts and traces for applying an electrical signal to the one or more LEDs. The LED and the surface around the LED can be blanketed by a layer of conversion material. The encapsulant can comprise a transparent material that is in a cubic shape over the LED and the submount. The conversion material layer can be of the type that converts light from the LED to another color or wavelength of light, and the conversion layer can be of a thickness and concentration such that less than all of the LED is converted on its first pass through the conversion material.

Some embodiments can comprise LED packages with a blue emitting LED on a submount, with a yellow conversion material layer over the surface of the LED and submount with the conversion material layer converting a portion of the blue light from the LED chip. A cubic encapsulant can be included over the LED and submount, with the layer of conversion material between the encapsulant and the LED/submount. The packages according to the present invention can comprise a thinner phosphor layer or lower phosphor concentration than in conventional LED packages at the same color point, such that more blue light passes through the conversion material layer on the first pass. Since typical conversion layers also scatter as well as convert blue light, this can lead to improved package efficiency since the reduced thickness or concentration of the conversion layer results in less scattering of the first-pass blue light emitted by the LED back into the LED, where it may be absorbed. By achieving a similar color compared to conventional LED packages but with a thinner or lower concentration conversion layer, cost savings may also be realized in the manufacture of the LED packages fabricated according to the present invention. A portion of blue and yellow light from the conversion material reaches the surface of the encapsulant within the critical angle and emits from LED package. Compared to conventional LED packages with hemispheric type encapsulants, a greater percentage of blue and yellow light will experience TIR such that light reflects within the encapsulant. This results in the blue and yellow light eventually reaching the conversion material following TIR; i.e. the light is recycled by TIR. Blue TIR light illuminates that top of the conversion layer, while blue light from the LED illuminates the bottom surface of the conversion layer, such that both sides of the conversion layer are illuminated. The "blanket" effect provided by the conversion material layer limits both blue and yellow light from re-entering the chip or hitting other absorbing regions on the submount. This reduces the amount of light that might be absorbed as the light experiences TIR within the package.

The conversion of blue light at the conversion layer results in omnidirectional re-emission of yellow light from the conversion material layer. Illumination of both sides of the conversion material layer results in conversions of TIR blue light into omnidirectional yellow light. This provides the advantage of allowing for greater opportunities for otherwise TIR light to escape from the package. This recycling can also scatter light, which can result in LED package emissions patterns that are wider than conventional devices that provide a predominantly Lambertian emission pattern. This scattering can also result in reduced variations in color temperature at different viewing angles.

It is understood that in other embodiments, the conversion material layer can coat only the LED, leaving the submount uncovered by the conversion material layer. For multiple LEDs embodiments, different conversion material layers can included on different ones of the LEDs. It also understood that in other embodiments having different conversion material layer embodiments, the different conversion materials can also coat some or all of the submount, which can result in different conversion materials covering the all or some of the submount, or different conversion materials in different areas of the submount. Accordingly, it is understood that in different embodiments, the conversion material can be on the LEDs, on the submount and/or in the encapsulant. These different embodiments can have different combinations of the conversion material locations. Other embodiments can have multiple phosphors on the LEDs, submount and or in the encapsulant. Some of these embodiments can comprise a three phosphor mixture such as yellow (e.g. YAG), green (e.g. LuAg) and reg (e.g. nitride). This is only one example of the many phosphor mixtures that can be used in different embodiments.

Other mechanisms which re-direct light within the encapsulant, such as scattering or refraction, may be used in combination with or in place of TIR. For example, in one embodiment, a scattering material may be added to the encapsulant to further enhance color uniformity in the light emitted by the package, or to produce a broader beam intensity profile while maintaining high package efficiency.

The different embodiments can comprise LED packages with one or more than one LED as their light source. The embodiments can also comprise LED packages with relatively small footprints, with some having a footprint smaller than 2 mm square. These embodiments can also provide devices having a footprint that is closer in size to the area covered by the LED. The embodiments can also exhibit height and footprint dimensions that are relatively close to one another as further described below.

For those embodiments with multiple LED light sources, individual ones of the LEDs can be individually addressable or controlled, or different strings or subsets of the multiple LEDs can be individually addressable or controlled. A string can be one LED or multiple LEDs coupled together in different parallel and/or serial connections to achieve the desired operating voltages or to achieve the desired package emission color temperature. This can be applicable to many different package arrangement such as those having LEDs emitting different colors or LEDs with phosphor coating that are from different bins.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, and the solder pads and attach pads can be arranged in many different ways. The LED packages can be provided to operate from different voltages including but not limited to 3V, 6V, 12V or 24 v. The packages may also have chips connected in series or parallel, and emit different colors of light beyond white, such as blue, green, red, red-orange, etc. Each of these can be multiple chip embodiments coupled together in different ways. For example, one embodiment could comprise four red emitting LEDs that can be coupled together in 2 serial strings of two red LEDs. This applies equally to all the colors interconnected in different ways.

The present invention may be described herein with reference to conversion materials, conversion material layers, wavelength conversion materials, remote phosphors, phosphors, phosphor layers and related terms. The use of these terms should not be construed as limiting. It is understood that the use of the term phosphor or phosphor layers is meant to encompass and be equally applicable to all wavelength conversion materials.

The embodiments below are described with reference to an LED or LEDs, but it is understood that this is meant to encompass LED chips. These components can have different shapes and sizes beyond those shown and different numbers of LEDs can be included. It is also understood that the embodiments described below utilize co-planar light sources, but it is understood that non co-planar light sources can also be used. It is also understood that an LED light source may be comprised of one or multiple LEDs, and in embodiments with more than one LED, the LEDs may have different emission wavelengths. In some embodiments, the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations. The LED packages can have different solid state light sources, such as LEDs as mentioned above, or solid state lasers.

It is also understood that when an element such as a layer, region or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4 through 13 show one embodiment of an LED package 50 according to the present invention comprising an LED 52, mounted on a submount 54. The LED package 50, also comprises first and second bottom contact/solder pads 60a and 60b on the bottom of the submount 54, first and second conductive vias 62a, 62b passing through the submount 54, and first and second die attach pads 64a, 64b on the top surface of the submount 54. The LED package further comprises a conversion material layer 56 covering the LED 52, the exposed surfaces of the die attach pads 64a, 64b, and exposed portions of the top surface of the submount 54. An encapsulant 58 is included over the LED 52, the attach pads 64a, 64b, and the submount 54. The above features of the LED package are described in detail below.

The LED 52 is shown as a single LED, but it is understood that in other embodiments (such as those described below) the light source can comprise more than one LED. Many different LEDs can be used such as those commercially available from Cree Inc., under its DA, EZ, GaN, MB, RT, TR, UT and XT families of LED chips. The LED package 50 is particularly arranged for use with the DA family of chips such as the DA850 chip that can be flip chip mounted and allows for wire-free bonding. These types of chips are generally described in U.S. patent application Ser. No. 12/463,709 to Donofrio et al., entitled "Semiconductor Light Emitting Diodes Having Reflective Structures and Methods of Fabricating Same," which is incorporated herein by reference. The LED 52 can emit many different colors of light, with a preferred LED 52 emitting light in the blue wavelength spectrum. It is understood that in some embodiments the LED can be provided following removal of its growth substrate. In other embodiment, the LED's growth substrate can remain on the LED 52, with some of these embodiments having a shaped or textured growth substrate.

In other embodiments, more than one LED can be used as the light source, while in other embodiments solid state lasers can used either alone or in combination with one or more LEDs. In some embodiments, the LEDs can comprise a transparent growth substrate such as silicon carbide, sapphire, GaN, GaP, etc. The LED chips can also comprise a three dimensional structure and in some embodiments, the LEDs can have structure comprising entirely or partially oblique facets on one or more surfaces of the chip.

The LED package 50 further comprises a submount 54, with the LED 52 mounted to the submount 54. The submount 54 can be formed of many different materials with a preferred material being electrically insulating, such as a dielectric material. The submount 54 can comprise a ceramic such as alumina, aluminum nitride, silicon carbide, or a polymeric material such as polymide and polyester. In the preferred embodiment, the submount 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The top surface of the submount 54 is shown having a planar surface with patterned conductive features that can comprise first and second die attach pads 64a, 64b. A space is provided between the attach pads 64a, 64b, with the LED chip 52 mounted to the pads 64a, 64b such that respective portions of the LED 52 are mounted to a respective one of the pads 64a and 64b and the LED 52 spans the space between the attach pads 64a, 64b. Many different mounting methods can be used, such as methods utilizing conventional solder materials.

Other types of LED chips can be electrically connected to the attach pads 64a, 64b or other conductive traces using known surface mount or wire bonding methods depending on the geometry of the LED 52.

The pads 64a, 64b can comprise many different materials, such as metals or other conductive materials, and in one embodiment they can comprise copper deposited using known techniques such as plating. In other embodiments pads 64a, 64b can be sputtered using a mask to form the desired pattern, and in other embodiments they can be formed using known photolithography processes. The pads 64a, 64b can extend beyond the edge of the LED 52 to cover most of the top surface of the submount 54. This helps in thermal management for the LED package 50 by spreading heat from the LED 52 into the pads 64a, 64b so that heat spreads beyond the edge of the LED 52 into more area of the submount 54. This allows the heat to be less localized and allows it to more efficiently dissipate through the surmount 54 into the ambient.

The conversion material layer 56 is included over the LED 52, exposed portions of the pads 64a and 64b, and exposed portions of the submount's top surface. Many different conversion materials can be used to generate the desired LED package light emission, with the present invention being particularly adapted to LED packages emitting white light. In some white emitting embodiments, the LED 52 can emit light in the blue wavelength spectrum. In other embodiments the LED can emit light in the violet to UV part of the spectrum for example in the wavelength range between 360 nm and 440 nm. The conversion material can be of the type that absorbs blue light and re-emits yellow light such that the package emits a white light combination of blue and yellow light. In some embodiments, the conversion material can comprise a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used include but is not limited to:

$Tb_{3-x}RE_xO_{12}$:Ce (TAG); RE=Y, Gd, La, Lu; or
$Sr_{2-x-y}Ba_xCa_ySiO_4$:Eu.

In other embodiments, the conversion material layer 56 can be arranged with more than one phosphor material either mixed or in separate layers. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}$S:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:

$SrGa_2S_4$:Eu;
$Sr_{2-y}Ba_ySiO_4$:Eu; or
$SrSi_2O_2N_2$:Eu.

The following lists some additional suitable phosphors used as conversion particles, although others can be used. Each exhibits excitation in the blue and/or UV emission spectrum, provides a desirable peak emission, has efficient light conversion, and has acceptable Stokes shift:

Blue
$BaMgAl_{10}O_{17}$:Eu $(Sr,Ba)_3MgSi_2O_8:Eu$
$(Ca,Sr)_5(PO4)_3Cl:Eu$
Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ In still other certain embodiments and dependent on the emission wavelength of the solid state light source, the conversion material layer can comprise at least three phosphors covering parts or all of the visible wavelength range, with some embodiments comprising a combination of yellow, red and green phosphors. For violet and UV emitting solid state light sources a blue phosphor may be added. Other combinations are possible, and other embodiments can comprise more than three phosphors. Many different yellow, red and green phosphors can be used, such as those described above.

The conversion material can comprise different sized phosphor particles including but not limited to particles in the range of 10 nanometers (nm) to 30 micrometers (µm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be fixed on the remote phosphor in a binder, and the phosphor can also have different concentrations or loading of phosphor materials in the binder. A typical concentration of phosphor in a binder is typically a range of 30-70% by weight. In one embodiment, the phosphor concentration is approximately 65% by weight, and is preferably uniformly dispersed throughout the remote phosphor. The conversion material layer 56 can also have different regions with different concentrations of phosphor particles.

Alternate wavelength conversion materials may also be used to down-convert light to generate white emissions. Such materials may be, but are not limited to organic fluorescent materials or dyes or inorganic quantum dot materials such as CdSe/ZnS, InP/InAs, CdS/CdSe, CdTe/CdSe or others.

The conversion material layer 56 can have many different thicknesses depending at least partially on the concentration of conversion material, the size of the conversion material particles, and the desired amount of light to be converted by the conversion material. Conversion material layer according to the present invention can be in a binder with phosphor concentration levels (phosphor loading) above 30%. Other embodiments can have concentration levels above 50%, while in still others the concentration level can be above 60%. In some embodiments the phosphor binder combination can have thicknesses in the range of 10-100 microns, while in other embodiments it can have thicknesses in the range of 40-50 microns. Thickness may also vary across the layer, with different regions having different thicknesses. As described in more detail below, the different packages according to the present invention can comprise conversion layers with less phosphor material (e.g. thinner or lower concentration) compared to similar packages with hemispheric encapsulants, while still maintaining the desired emission color point. This reduction in thickness depends on many different factors, such as the phosphor type, size of phosphor particles, and concentration of phosphor particles in the layer. In some embodiments, the reduction can be 10% or more compared to a similar LED package with hemispheric lens. In still other embodiments it can be 20% or more, while in other embodiments it can be 30% or more.

The conversion material layer 56 can also comprise a binder, and different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. It is understood, however, that the phosphor particles can be applied without a binder.

The conversion material layer can be applied using different processes including but not limited to spraying, dispensing, spin coating, sputtering, printing, powder coating, electrophoretic deposition (EPD), and electrostatic deposition, among others. These processes can also include a solvent in the phosphor-binder mixture that can liquefy and lower the viscosity of the mixture. Many different solvents can be used including but not limited to toluene, benzene, zylene, or OS-20 commercially available from Dow Corning®, and different concentration of the solvent can be used. When the solvent-phosphor-binder mixture is sprayed, poured or dispersed heat from the remote phosphor evaporates the solvent and can also cure the binder in the mixture leaving a fixed phosphor layer. Various deposition methods and systems are described in U.S. Patent Application Publication No. 2010/0155763, to Donofrio et al., entitled "Systems and Methods for Application of Optical Materials to Optical Elements," and also assigned to Cree, Inc.

Encapsulant 58 is included on the conversion material layer 56, and over the LED 52 and submount 54, with the encapsulant 58 providing environmental and mechanical protection, as well as allowing for the recycling of light as described above and described in more detail below. Unlike most conventional encapsulants formed over an LED, the encapsulant 58 has planar surfaces, and in the embodiment shown the encapsulant 58 has a generally cubic shape. The encapsulant includes both vertical and horizontal planar surfaces in the shape of a cube, but it is understood that encapsulant can take many different shapes such as any shape having a flat top and vertical sidewalls with planar surfaces. These can include but are not limited to different prismatic or polygon shapes such as triangles, pentagons, hexagons, octagons, etc. These shapes can include a horizontal planar surface, with vertical surfaces numbering in the range of 3 to 12 or more. In still other embodiments, the encapsulant can be cylindrical with different cross sections such as circular or oval.

It is understood that encapsulant 58 and the LED 52 can be aligned in many different ways, with the LED 52 as shown approximately aligned with the center or longitudinal axis of the encapsulant 58. In other embodiments, the LED 52 can be closer to one of the edges of the encapsulant 58.

Many different materials can be used for the encapsulant 58 such as silicones, plastics, epoxies or glass, with a suitable material being compatible with molding processes. Silicone is suitable for molding and provides suitable optical transmission properties. It can also withstand subsequent reflow processes and does not significantly degrade over time. The encapsulant can also be formed using many different methods, and in some embodiments a molding process (described in more detail below) can be used that simultaneously forms encapsulants 58 over a multitude of LEDs 52 on a submount panel.

In different embodiments, the encapsulant can have many different thicknesses, with some providing just enough encapsulant material to cover the LED and phosphor layer. In these embodiments, the layer can be as thin as 10 μm or more. In still other embodiments, the encapsulant can be as high as three times the submounts edge dimension. These are only some examples of encapsulant height, with other embodiments being thinner or higher.

In some embodiments, the top surface of the encapsulant can have a slightly smaller area than the bottom of the encapsulant and/or the footprint of the LED package. In still other embodiments, the upper portions of the encapsulant can have a larger area than lower portions, or a larger area than the LED package footprint.

The LED chip 50 also comprises first and second solder pads 60a, 60b formed on the bottom surface of the submount 54, which can be used for mounting the LED package 52 in place using known mounting methods. It is understood that in other embodiments (as described below), LED packages according to the present invention can have more than two solder pads. The solder pads 60a, 60b can be made of the same materials and can be formed of the same way as die attach pads 64a, 64b. First and second conductive vias 62a, 62b can be included that pass through the submount 54 with the vias being formed of an electrically conductive material such as those used for the die attach pads and solder pads, and are arranged to provide an electrically conductive path between the solder pads 60a, 60b and the die attach pads 64a, 64b. In the embodiment shown, first via 62a forms an electrically conductive path between the first solder pad 60a and the first die attach pad 64a, while second via 62b provides a conductive path between the second solder pad 60b and the second die attach pad 64b. This allows an electrical signal applied to the solder pads 60a, 60b to be conducted through the submount 54 along the vias 62a, 62b, to the die attach pads 64a, 64b. The signal is then conducted to the LED 52, through the die attach pads. It is understood that in other embodiments the electrical signal can be transmitted to the LED in other ways such as through conductive traces or wire bond pads arranged in different locations in the LED package, and running between the mounting surface or the submount, and the LED.

As mentioned above, the LED packages according to the present invention are relatively small, and as LED packages become smaller less space is available for including indicators showing polarity of an LED package. These indicators can be important when manufacturing the end product utilizing the LED packages. Conventional polarity indicators can comprise marks on the top surface of the LED package or where one solder pad can be larger than the other. With smaller LED packages there can be less room for marking on the top surface, and it can also be undesirable to make on solder pad smaller than the other because of resulting increases in the danger of soldering defects.

Figures 8, 9:
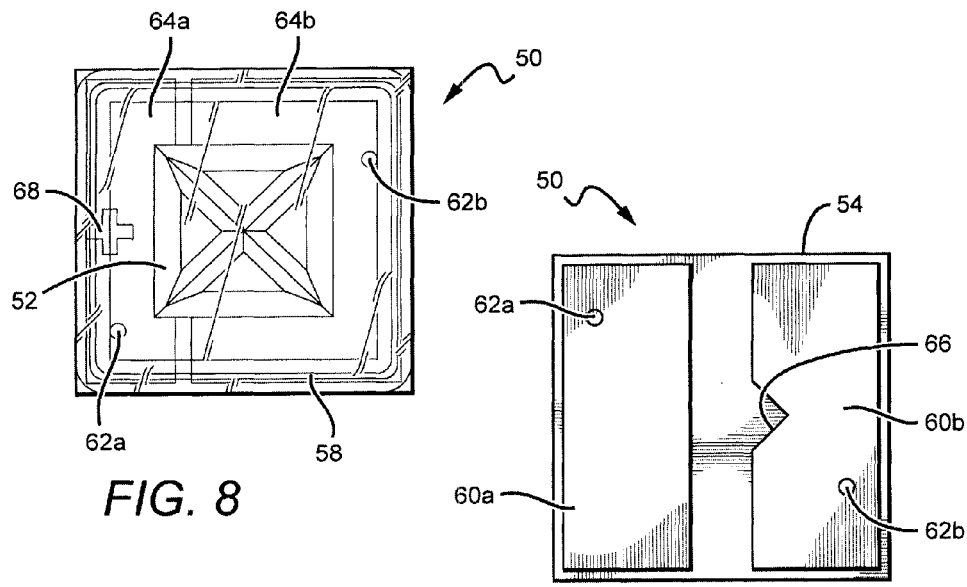
FIG. 8 is a top view of the LED package shown in FIG. 4.
FIG. 9 is a bottom view of the LED package shown in FIG. 4.
Figure 16:
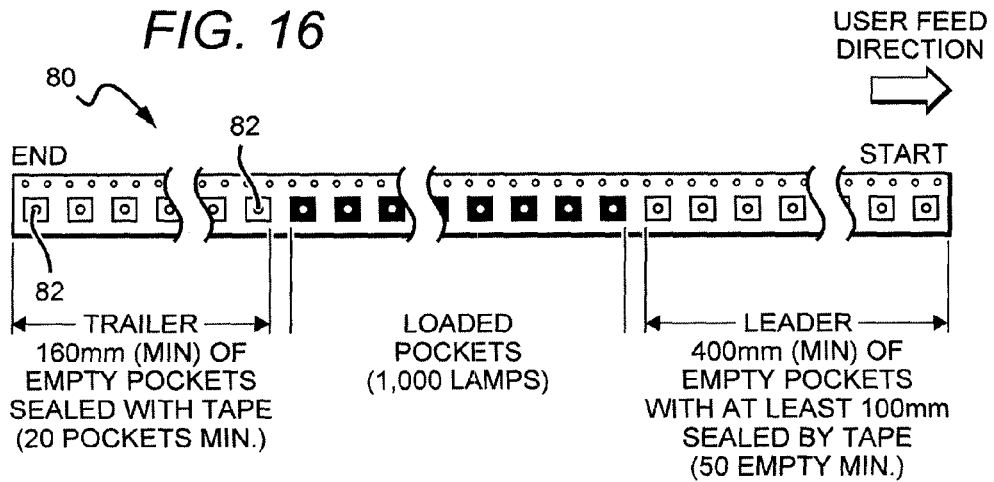
FIG. 16 is top view of a conventional LED carrier tape.

The LED packages according to the present invention provide improved structures and methods of providing polarity indication by forming one or more indication notches 66 in one of the solder pads. As best shown in FIGS. 5 and 9, V-shaped polarity indication notch can be formed along the inner edge of the solder pad 64a. This notch 66 can be detected with up-looking cameras on automated pick-and-place equipment during manufacturing. In the embodiment shown, the notch 66 is near the center of the pad's inner edge placing it near the center of the submount 54. Referring now to FIG. 16, a conventional LED package carrier tape 80 is shown that comprises holes 82 beneath each of the LED packages it carries. The notch 66 in FIGS. 8 and 9 is in the area of the submount 54 near the center that can be visible through hole 82 in the carrier tape 80. This allows for the notch (and the corresponding LED package polarity) to be visible and verified carrier tape hole 82 without removing the LED package from the carrier tape 80.

The notch 66 can have many different shapes beyond V-shaped, such as U-shaped, I-shaped, W-shaped, square shaped, rectangular shaped, star shaped, plus shaped, minus shaped, etc. The notch can also be included in many different locations on the solder pads 60a, 60b as further described below, and can similarly be detected by the camera of conventional pick and place equipment. It is noted that other types of polarity indicators can be used, such as holes of different shapes or other cutouts in the solder pads, and in other embodiments the LED packages can have indicators in other locations, such as on the submount 54.

Referring again to FIGS. 4 through 9, some embodiments according to the present invention can also comprise polarity indicators on the top surfaces of the LED package 50. In the embodiment shown, the second attach pad 64b can have a plus (+) indicator 68 to show polarity when viewing the LED package 50 from the top. These indicators can take many different shapes and sizes such as those described above, and in some embodiments can comprise notches or holes as described above. As also mentioned above, for LED packages of the size shown in the attached figures and described herein, there may be limited space for top polarity indicators, and manufacturing devices may need to rely on the bottom polarity indicators.

Figures 10, 11:
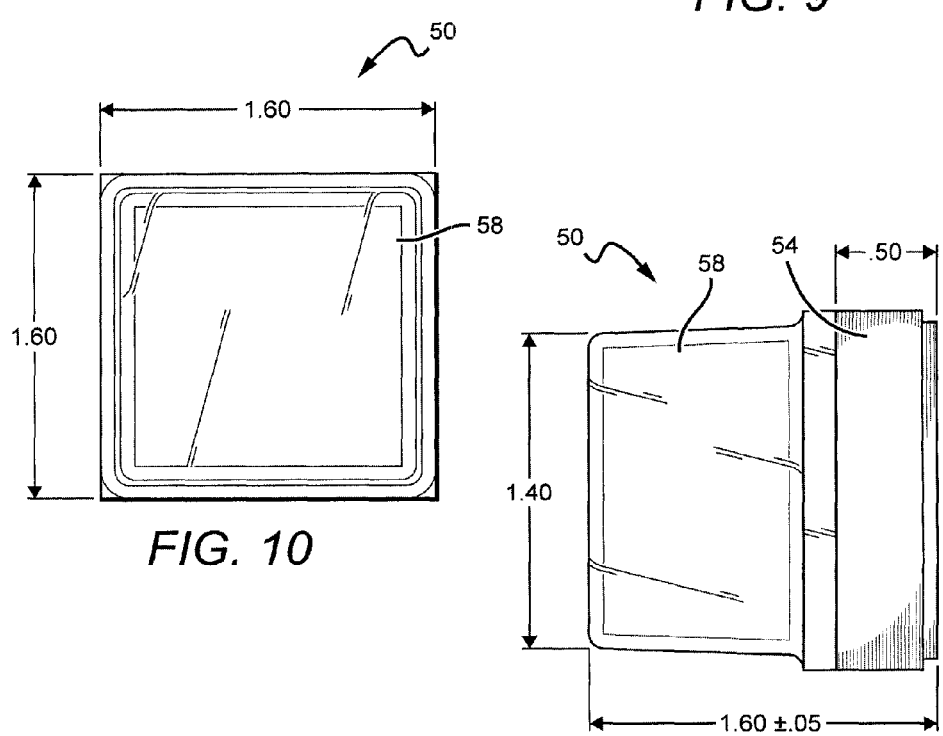
FIG. 10 is another top view of the LED package shown in FIG. 4 showing one embodiment of its dimensions.
FIG. 11 is another side view of the LED package shown in FIG. 4 showing one embodiment of its dimensions.
Figure 12:
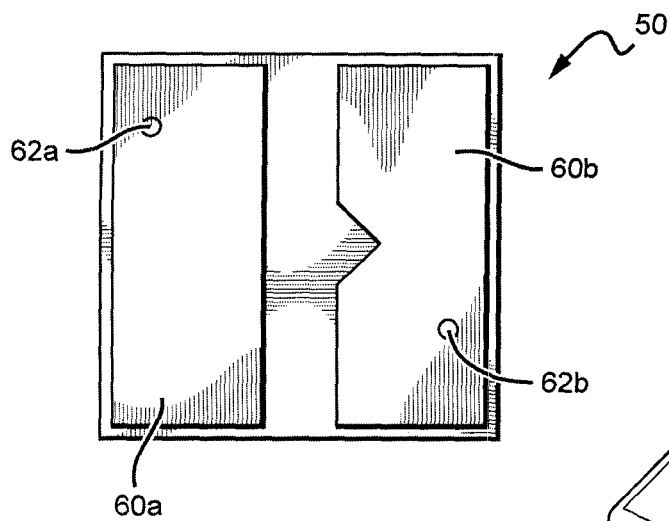
FIG. 12 is another top view of the LED package shown in FIG. 4 showing one embodiment of its dimensions.
Figure 13:
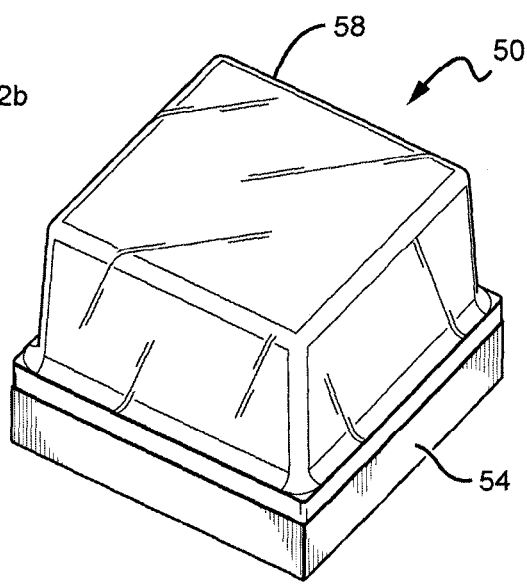
FIG. 13 is another perspective view of the LED package shown in FIG. 4.
Figure 15:
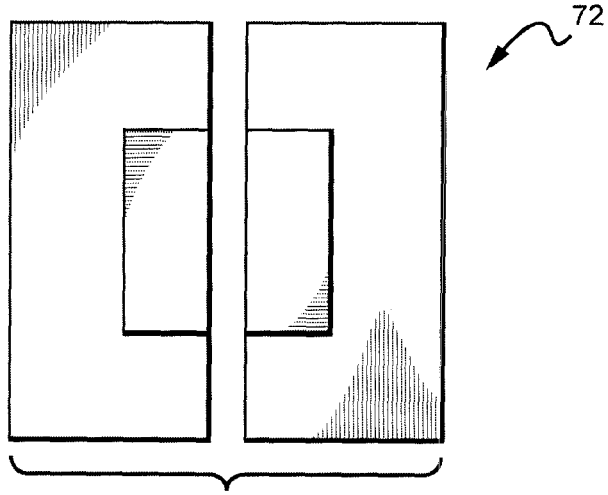
FIG. 15 shows one embodiment of a trace layout that can be used with LED packages according to the present invention.
Figure 14:
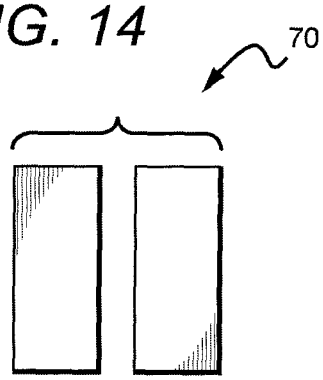
FIG. 14 shows one embodiment of a solder pad that can be used with LED packages according to the present invention.

Referring to FIGS. 10 and 13, the LED package 50 is shown without the submount 54 being visible through the encapsulant 58. This is done for ease of illustration, but it is understood that some embodiments according to the present invention can have an encapsulant that is not transparent for different reasons. In some embodiments the encapsulant can have phosphors and/or scattering particles dispersed throughout or in particular locations in the encapsulant. This can make the encapsulant either partially or fully opaque. FIG. 14 shows one recommended solder pad for the some LED packages according to the present invention, and FIG. 15 shows the recommended trace layout.

As mentioned above, conventional knowledge in art was that TIR of LED light resulting from the planar surfaces of the encapsulant would result in significant reduction in LED package emission efficiency. This is particularly true for LED packages with vertical planar surfaces. It was thought that the TIR light would encounter light absorbing features of the LED package and would result in significant percentage of light being absorbed. This conventional knowledge focused LED packages providing encapsulants that minimize TIR, such as hemispheric encapsulants. The focus was also on providing package light sources near the center of the base of the encapsulant to simulate a point source near the center. However, by providing a blanket conversion material layer over the top surfaces under the encapsulant 58, including on the LED 52, areas of the die attach pads 64a, 64b around the LED 52, and the top surface of the submount 54 exposed around the LED 52 and the attach pads 64a, 64b, this expected efficiency loss can be minimized or eliminated.

Figure 17:
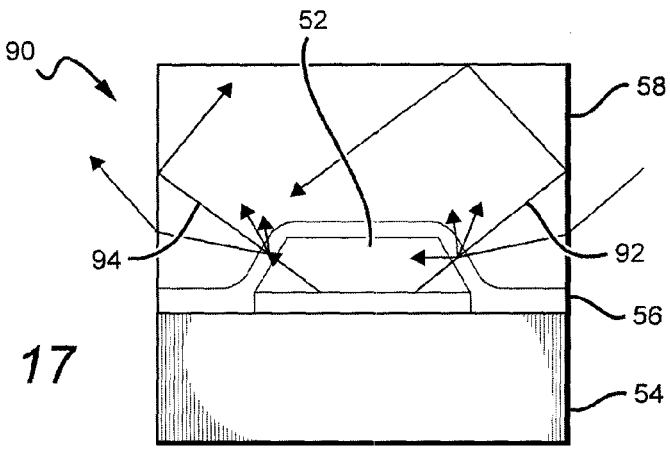
FIG. 17 is a sectional view of one embodiment of and LED package according to the present invention.

Referring now to FIG. 17, an exemplary LED package 90 according to the invention is shown with sample blue and yellow light traces 92, 94. The LED package 90 comprises many of the same or similar features to those in LED package 50, and for those features the same reference numbers will be used herein. The LED package 90 comprises and LED 52, submount 54, conversion material layer 56, and an encapsulant 58. The LED package 90 can be arranged to emit different colors of light, and in the embodiment shown the LED chip 52 emits blue light, and the conversion material layer 56 comprises a conversion material that converts blue light to yellow light. Referring to the blue light trace 92, a portion of the blue light passes through the conversion material layer 56 and experiences TIR when it reaches the surface of the encapsulant 58. Other portions of the blue light 92 pass out of the encapsulant to contribute to emission from the LED package.

The blue TIR light reflects within the encapsulant and is eventually directed back toward the submount 54. Instead of reaching a light absorbing portion of the LED package, the TIR reaches the conversion material layer 56. This blue light has already passed through the conversion layer 56, and following TIR the blue LED light encounters the conversion material layer a second time. This can be referred to as "recycling" of the blue light that results in illumination of the top surface of the conversion material layer 56 such that both sides of the layer are illuminated by blue light during operation. The conversion material layer 56 provides a "blanket" effect that helps limit both blue and yellow light from re-entering the chip or hitting absorbing regions. When the blue light 92 hits the conversion material layer 56 a second time, all or a portion of the light will be scattered or absorbed by the conversion material in the layer and re-emitted as yellow light. The re-emission will be omnidirectional or isotropic such that a portion of the TIR light will be redirected so that it emits from the LED package. This omnidirectional reemission amounts to scattering of otherwise TIR light to allow for the light to reach the encapsulant surface within the critical angle and emit from the encapsulant.

When the blue light passes through the conversion material layer the first time, a portion of the blue light is converted to yellow light as shown in light trace 94. A portion of yellow will emit from the package on its first pass, while the remainder will experience TIR. This light can also experience scattering when it encounters the phosphor material a second time, increasing the likelihood that some of the light will emit from the encapsulant and contribute to overall emission.

The result is that the TIR and recycling allows for emission efficiencies of the LED packages according to the present invention to be similar to conventional hemispheric lensed LEDs. Embodiments of the present invention have reduced concentrations of conversion material in the conversion material layer to achieve the same color point due to the recycling effect. This can allow for more blue light to pass through the phosphor on the first pass. Since typical conversion layers can scatter as well as convert blue light, a reduced thickness or concentration of conversion material on the chip can mean that less of this first-pass blue light is scattered back into the LED where it may be absorbed, thereby improving package efficiency. This first-pass blue light can then be converted and scattered when it reaches the conversion material layer 56 a second time. This scattering allows for more light to escape from the LED package, while maintaining the proper emission balance between blue and yellow light to achieve the desired color point. The different embodiments can comprise 20-30% less conversion material compared to conventional LED packages. This reduction in conversion material, as well as reduced package size, can result in less costly LED packages with the same or similar emission efficiencies. This arrangement allows for smaller devices, which can also reduce costs.

Figure 18:
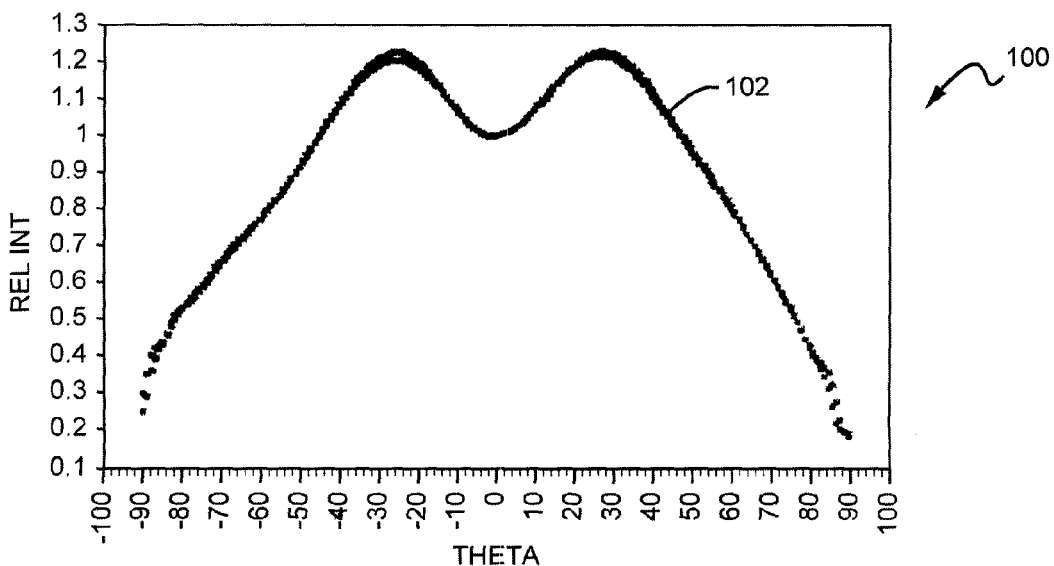
FIG. 18 is an emission profile graph for one embodiment of an LED package according to the present invention.

In some embodiments, the scattering during recycling of the light can also provide additional advantages of a broader emission profile. In most conventional LED packages the emission profile is generally Lambertian with most having an emission profile of approximately 120° FWHM or less. The scattering of light provided in the embodiments of the present invention provide more light emitting from the encapsulant at greater angles than would be experienced in a conventional lambertion emission profile. In some embodiments, the emission profile can exceed 120 degrees FWHM, while in other embodiments it can exceed 130 degrees FWHM. In still other embodiments the emission profile can be in the range of 130 to 170° FWHM, or 130 to 160° FWHM, or 130 to 150° FWHM in other embodiments. FIG. 18 is a graph 100 showing an emission profile 102 for one embodiment of an LED package according to the present invention having and emission profile of approximately 150° FWHM. In other embodiments the emission profile can be greater than 135° FWHM, with less than 10% color variation of viewing angles of −90° to +90°.

As mentioned above, scattering materials may be added to the encapsulant to further increase the width of the emission profile and improve color uniformity with minimal impact on package efficiency. This wider emission profile allows for the LED packages according to the present invention to be particularly applicable to lighting applications needing wider angles of emission, such as area lighting. For LED lighting that relies on mixing chambers to mix light from the LED packages, the broader emission pattern can result in lighting fixtures with reduced mixing chamber depths.

Figure 19:
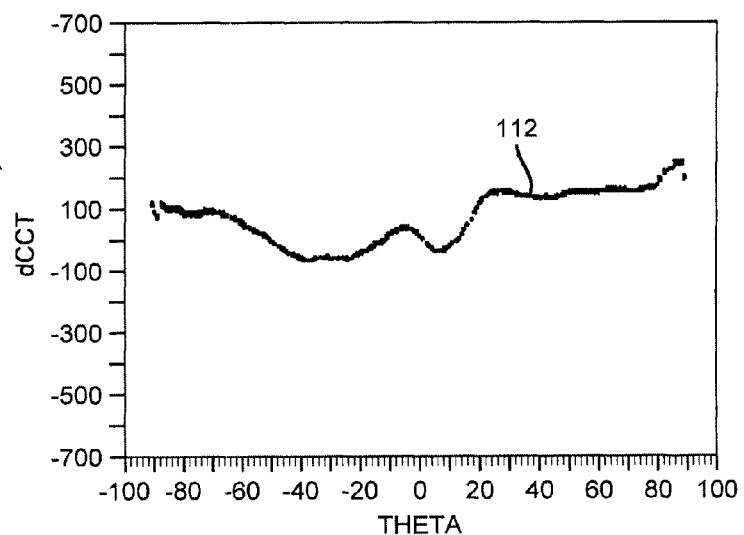
FIG. 19 is a color temperature profile graph for one embodiment of an LED package according to the present invention.
Figure 20:
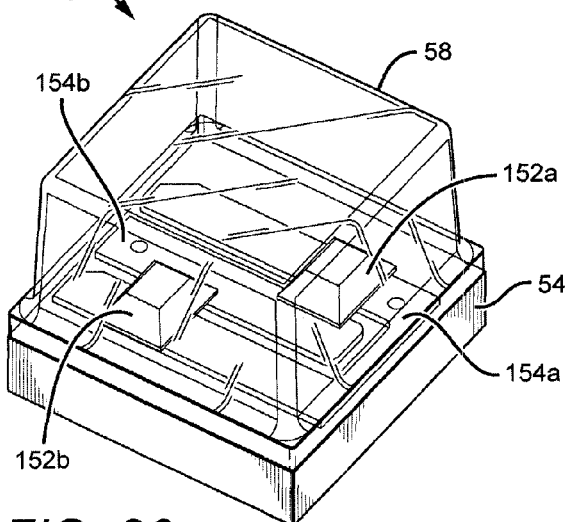
FIG. 20 is a top perspective view of one embodiment of an LED package according to the present invention.
Figure 21:
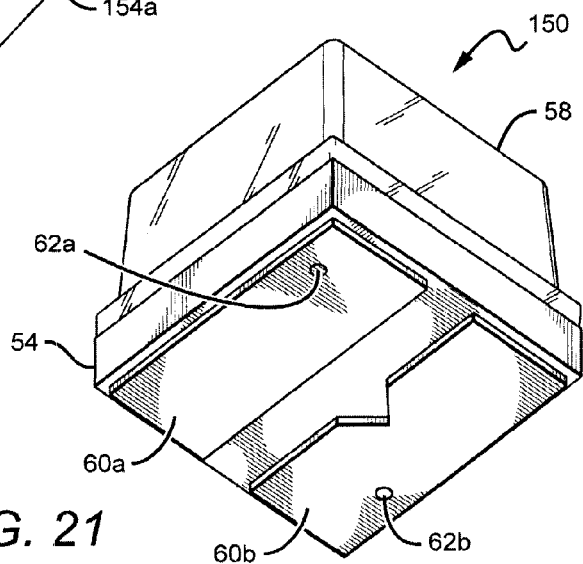
FIG. 21 is bottom perspective view of the LED package shown in FIG. 20.
Figure 26:
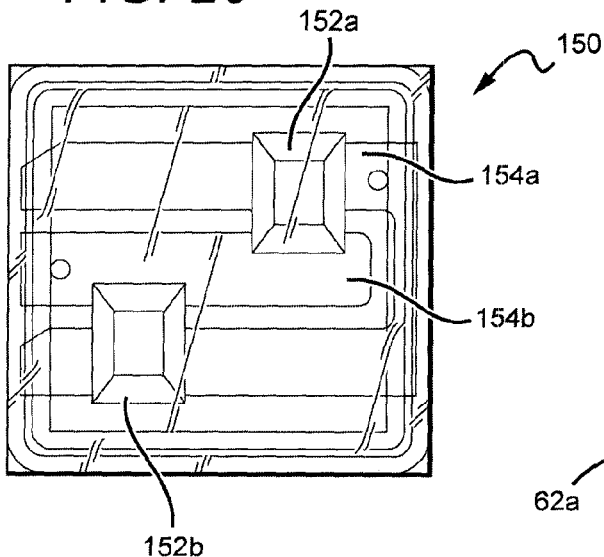
FIG. 26 is a top view of the LED package shown in FIG. 20.
Figure 27:
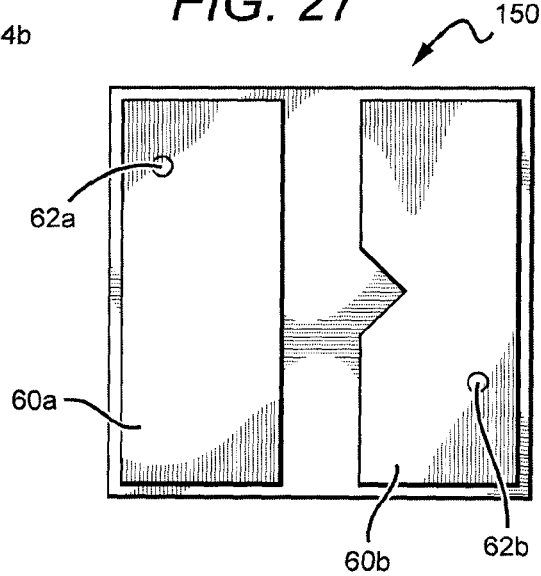
FIG. 27 is a bottom view of the LED package shown in FIG. 20.
Figure 28:
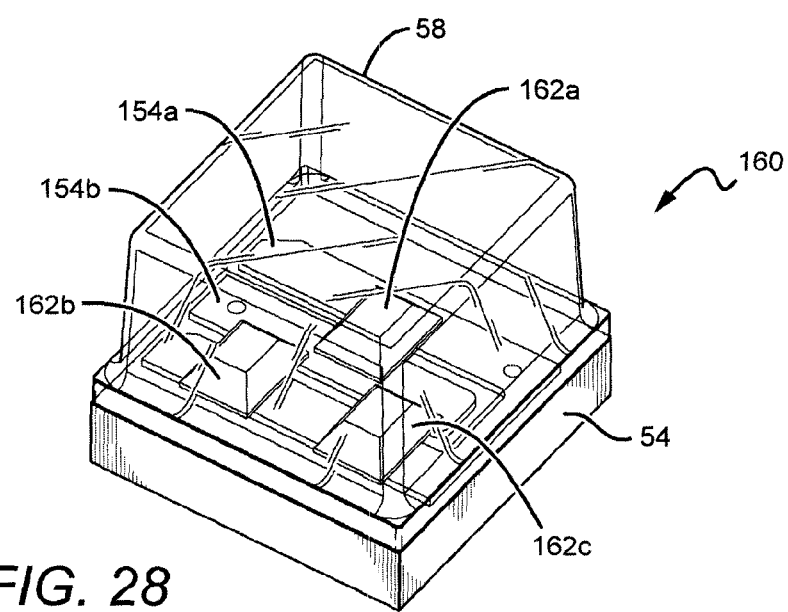
FIG. 28 is a top perspective view of one embodiment of an LED package according to the present invention.
Figure 29:
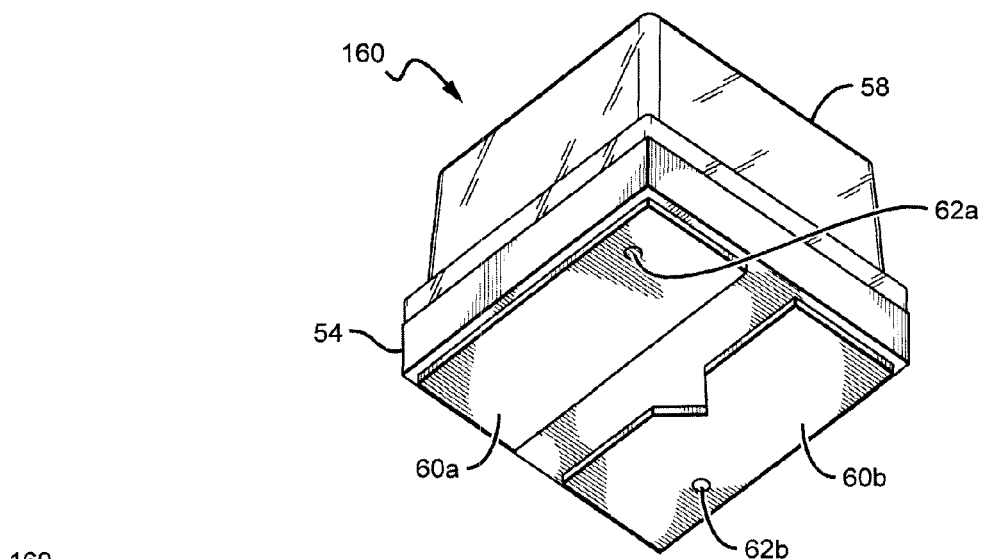
FIG. 29 is a bottom perspective view the LED package shown in FIG. 28.
Figure 30:
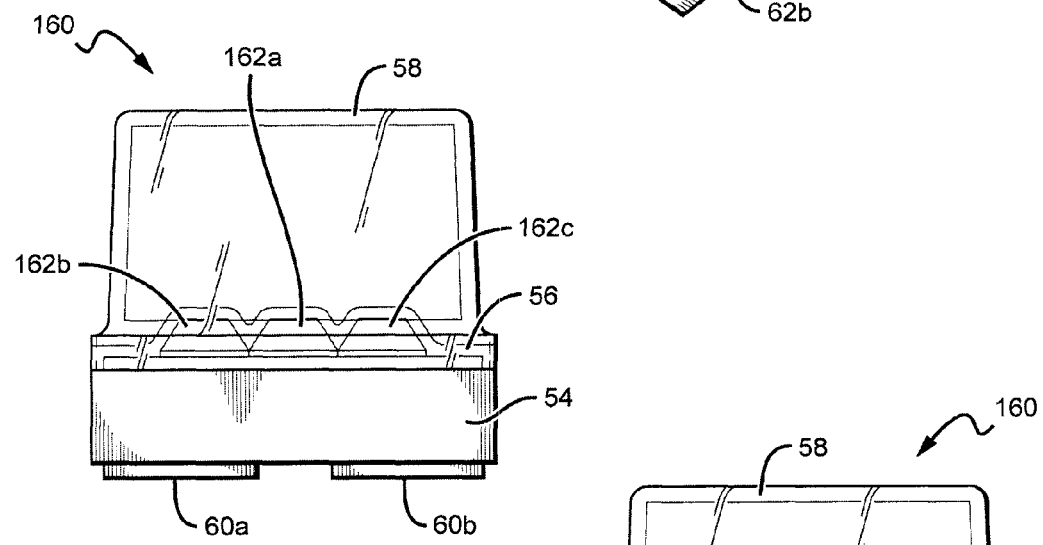
FIGS. 30 through 33 are side elevation views of the LED package shown in FIG. 28.
Figure 31:
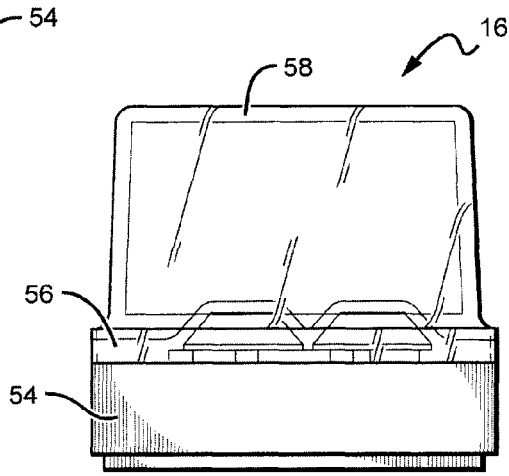
Figure 32:
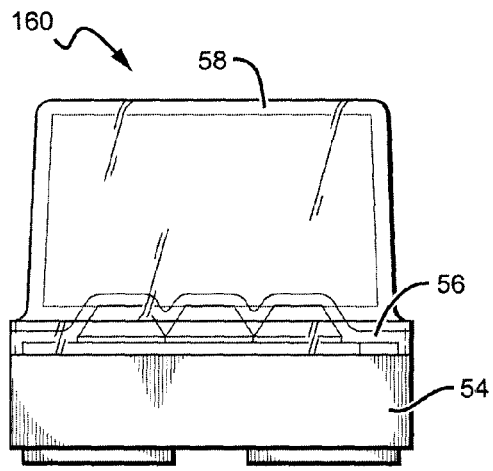
Figure 33:
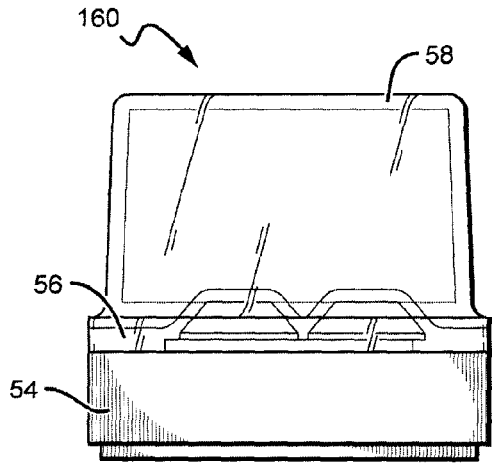
Figure 34:
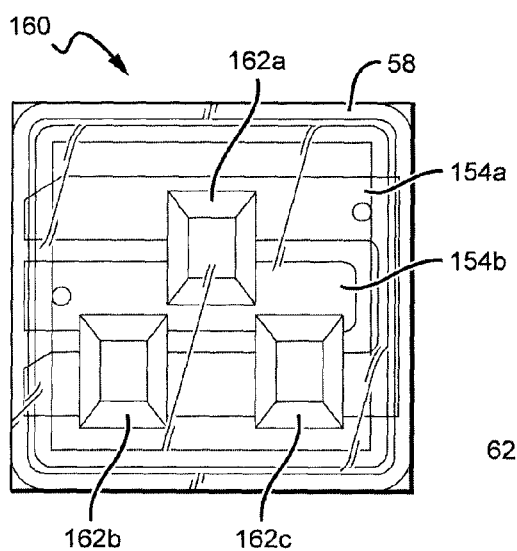
FIG. 34 is a top view of the LED package shown in FIG. 28.
Figure 35:
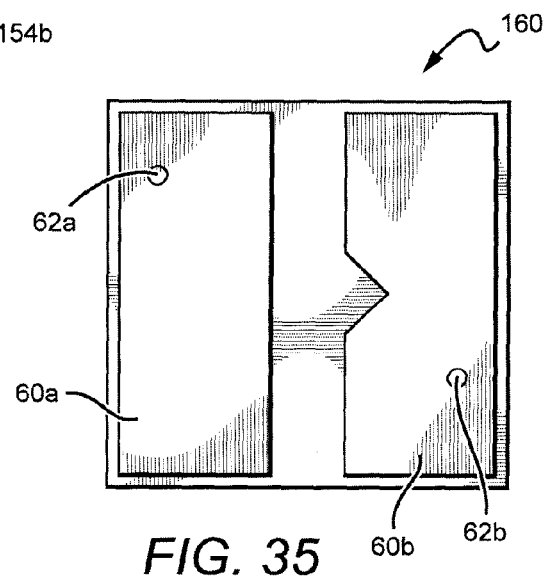
FIG. 35 is a bottom view of the LED package shown in FIG. 28.

The LED packages according to the present invention can also emit light with more uniform color emission at different viewing angles. In some embodiments, the packages and emit light with variations in color temperature of less than −400 to +400 kelvin and viewing angles of approximately −100 to +100 degrees. In still other embodiments, the variations in color temperature can be less than −300 to +300 kelvin and viewing angles of approximately −100 to +100 degrees. FIG. 19 is a graph 110 showing variations in color temperature 112 over viewing angle for one embodiment of an LED package according to the present invention. The variations over viewing angles are from −100 to +100 degrees and are generally in the range of −100 to +200 Kelvin.

The blanketing of the conversion material layer also allows the conversion material layer to act as a remote layer with good thermal spreading. That is, heat generated during the conversion process, or heat from the LED 52 that passes into the conversion material layer 56 can be spread across the conversion material layer 56. The heat can then conduct into the submount 54 and the encapsulant 58 to dissipate into the surrounding ambient. This allows for more efficient dissipation of heat compared to conventional packages having LEDs with conversion material only on the LED.

Some embodiments according to the present invention provide LED packages having smaller footprints compared to conventional LED packages with hemispheric encapsulants, while still emitting with the same or similar efficiency. In some embodiments, the LED package footprint can be less than 3 mm by 3 mm or larger, while in other embodiments it can be 2 mm by 2 mm or larger. In still other embodiments it can be 1 mm by 1 mm or larger with some embodiments according to the present invention be approximately 1.6 mm by 1.6 mm. The LED packages according to the present invention can be scalable to many different larger or smaller sizes. The encapsulants in LED packages according to the present invention can extend up to the edge of the submount, while LED packages with hemispheric encapsulants can have submounts that extend beyond the edge of the encapsulant, thereby increasing the overall size of the package footprint.

The LED package according to the present invention can also provide for efficient light emission for devices with a smaller ratio of LED chip area to LED package footprint. This allows for the edge of the LED to be closer to the edge of the encapsulant to provide greater LED emission area per LED package footprint. In some embodiments, the edge of the LED chip (or LED chip array) can be approximately at or near the edge of the encapsulant such that the LED package has substantially the same footprint as the LED chips (or LED chip array). In some embodiments, the ratio of LED chip (or array) area to LED package footprint can be less than six, while in other embodiments it can be less than five. In still other embodiments it can be less than four, with some embodiments having a ratio of approximately 3.5. In one embodiment according to the present invention that is the same or similar to the LED package 50 shown in FIGS. 4 through 9 and described above, the LED chip 52 can be approximately 850 µm square, with the LED package footprint being approximately 1.6 mm square. This results in an LED chip area to LED package footprint of approximately 3.54. In some multiple LED embodiments as described below, this ratio can be less than 3.

The LED packages according to the present invention can also have smaller footprints compared to conventional LED packages with hemispheric encapsulants. In some embodiments, the footprint can be less than 12 mm square. In still other embodiments footprint can have an area of less than approximately 9 mm square, less than 6 mm square, or less than 4 mm square. In some embodiments the package can have a footprint area in the range of 1 to 4 mm. In some embodiments the LED package can have an approximately 1.6 mm by 1.6 mm submount, with a footprint area of approximately 2.56 mm square.

In still other embodiments, the submount area for LED packages having a single LED as well as those having multiple LED the submount footprint can be as low as the LED area plus 2 times the conversion material layer thickness at the edge of the submount. In embodiment having a single 1 mm LED, the submount area can be as low as 1.21 mm, resulting in a ratio the ratio of LED chip area to LED package footprint of 1.21. In multiple LED chip embodiments, such as those with chips placed edge to edge, the same ratios are can be reached. Different ratios can also be achieved with submounts having different shapes. In embodiments having 16 DA240 LEDs mounted on a rectangular submount having one side length 16 time 0.240 mm plus 2 time 0.05 mm, while the other would be 16 times 0.320 mm plus 2 times 0.05 mm. The ratio the ratio of LED chip (or array) area to LED package footprint in these embodiments can be as low as approximate 1.046.

In still other embodiments, the ratio can be as high as 20 or more. In different embodiments, the ratio can fall in the range of 1 to 20, 1 to 15, 1 to 10, 1 to 5, 1 to 3, or 1 to 2. In embodiments having two DA240 LEDs on a 1.6 mm submount the ratio of LED area to submount footprint is approximately 16.67. This same improved ratio is applicable to LED packages with smaller or larger footprints. The present invention also allows for these packages to exhibit the same improved ratio, but having larger or smaller area LED chips as the case may be.

By having greater LED area for package footprint, the LED packages can be used in place of conventional LED packages, and for the same amount of area can provide greater LED emission area. In many applications, this allows for driving the same area of LED packages with a lower drive signal to achieve the same emission intensity. Similarly, the same drive current can be used, and the LED packages according to the present invention can be used to generate higher emission intensity.

The embodiments according to the present invention can also have different combinations of footprint ratio dimensions to height dimensions. In some embodiments, the ratio of footprint dimensions can be 1 by 1, with a corresponding height ratio of less than one. In some embodiments, the LED packages can have a footprint measuring 1.6 by 1.6, with a height of approximately 1.3 mm, giving dimension ratios of 1 by 1 by approximately 0.8125. In still other embodiments, the ratio of footprint to height can be approximately 1 by 1 by 1 with some embodiments having footprint measuring 1.6 mm by 1.6 mm, and having a height of approximately 1.6 mm. Other embodiments can comprise a ratio of 1 by 1 by greater than 1, and other embodiments can have a dimension of 1 by 1 by greater than 1.5. Still other embodiments can have dimensions of 1 by 1 by greater than 1.5 or greater, or 1 by 1 by 2 or greater, or 1 by 1 by 3 or greater.

Other embodiments according to the present invention can have different encapsulant heights, with this height being measured from the bottom or top surface of the submount. In some embodiments, the height of the encapsulant can be as low as 0.3 mm to as high as 5 mm or more. In still other embodiments, the encapsulant can be 2 mm high or more. In still other embodiments, it can be 1 mm high or more. It is noted that in some embodiments, the emission pattern of the packages can change with the height of the encapsulant, with some embodiments having a wider emission pattern for higher encapsulants. For example, the in embodiments having a single LED and cubic encapsulants, emission pattern for a package having a 0.625 mm high encapsulant (measured from the top surface of the submount) can have an emission pattern that is approximately 8% wider than the same package with a 0.525 mm encapsulant. For a package with a 0.725 mm encapsulant, the emission pattern width can be increased further, up to approximately 5% wide. This increased emission pattern can be realized with higher encapsulants, without significant variations in emission efficiency.

The different LED package embodiments can operate from different drive signals, with some operating from signals as low as 50 mWatts to several tens of Watts. In some embodiments, the drive signal can be in the range of 500 mWatts to approximately 2 Watts. The different embodiments can also provide different luminous flux output, with some embodiments emitting 100 lumens or more. Other embodiments can emit 110 lumens or more, while other embodiments can emit 150 lumens or more. Different embodiments can also emit different color temperatures in the range of 2000 to 6000K, with some embodiments emitting approximately 3000K and others approximately 5000K. By way of example, an LED package according to the present invention having a package footprint of 1.6 by 1.6 mm, can emit approximately 120 lumens at a temperature of 3000K. Other embodiments having the same size can emit 140 lumens at 5000K. The area for the package footprint is 2.56 mm$^2$ resulting in emission of 47 lumens/mm$^2$ at 3000K, and 55 lumens/mm$^2$ at 5000K. Different packages according to the present invention can generally emit in the range of 35 to lumens/mm$^2$. Packages that are approximately 1.6 mm tall can have a volume of approximately 4.096 mm$^3$, resulting in operation at approximately 29.27 lumens/mm$^3$ at 3000K and 34.18 lumens/mm$^3$ at 5000K. Different packages according to the present invention can generally emit in the range of 20 to 45 lumens/mm$^3$. This can vary depending on the drive signal (or drive current) but does, however, result in a operation of 115 lumens per Watt (LPW) at 3000K, and 135 LPW at 5000K. Other embodiments having different drive signals can also exhibit similar LPW operation at the same color temperature. The range of LPW for the different embodiments can generally be in the range of 100 to 150 LPW.

As discussed above, different packages according to the present invention can have more than one LED as their light source. FIGS. 20 through 27 show another embodiment of an LED package 150 according to the present invention comprising a submount 54, conversion material layer 56, encapsulant 58, solder pads 60a, 60b and conductive vias 62a, 62b. In this embodiment, the light source comprises first and second LEDs 152a, 152b mounted to first and second die attach pads 154a, 154b on the submount. The LEDs 152a, 152b can comprise many different commercially available LEDs such as those described above, with some embodiments utilizing DA350 LEDs commercially available from Cree, Inc. The LEDs 152a, 152b can have different dimensions, with some embodiments being approximately 350 μm by 470 μm.

The die attach pads 154a, 154b can be made of the same materials as described above and can be deposited using the same methods. In this embodiment the first die attach pad 154a is U-shaped and the second die attach pad 154b is elongated and is arranged between the legs of the first die attach pad 154a. A space is provided between the first and second attach pads 154a, 154b with each of the LEDs 152a, 152b mounted to the first and second attach pads 154a, 154b and each spanning the space between two. The LEDs 152a, 152b can be mounted in different locations on attach pads 154a, 154b, with the first LED 152a mounted generally in one corner of the submount 54, and the second LED mounted at the opposite corner of the submount 54. During operation, an electrical signal is applied to the solder pads 60a, 60b that is transmitted to the attach pads 154a, 154b through the vias 62a, 62b. The signal is then transmitted to the LEDs 152a, 152b causing them to emit light. The LED package operates in much the same way as LED package 50, and can have the same sizes and ratios described above.

FIGS. 28 through 35 show another embodiment of an LED package 160 according to the present invention comprising a submount 54, conversion material layer 56, encapsulant 58, solder pads 60a, 60b, conductive vias 62a, 62b, and die attach pads 154a, 154b similar to those in LED package 150 described above. In this embodiment, the LED package light source comprises first, second and third LEDs 162a, 162b, 162c with each of the LEDs mounted to the attach pads 154a, 154b across the space between the two. The LEDs can be mounted in many different locations, with first and second LEDs 162a, 162b mounted along one leg of attach pad 154a, and third LED 162c mounted along the other leg. The third LED 162c is generally aligned with the space between the first and second LEDs 162a, 162b, but it is understood that the LEDs can be mounted in relation to each other in many different ways. The LED package 160 operates in much the same way as the LEDs packages described above, and can have the same size and dimension ratios.

The LED packages 150 and 160 have multiple LEDs electrically connected in parallel, but it is understood that the LEDs can also be connected in series. For packages having a plurality of LEDs, the LEDs can be connected in different parallel and series combination. Different series connected LEDs can be separately controlled (i.e. independently addressable) and in these embodiments the submount can comprise more than two solder pads so that multiple signals can be applied to the LED chip.

As mentioned above, these LED packages can be arranged operate from different voltages including but not limited to 3V, 6V, 12V or 24 v. The packages may also have chips connected in series or parallel, and emit different colors of light beyond white, such as blue, green, red, red-orange, etc. Each of these can be multiple chip embodiments coupled together in different ways. Some embodiments can emit one of these colors of light and can comprise 2 or 3 LEDs coupled together in parallel and operating from a 3V signal. Other embodiments can comprise 2 LED coupled in series such that the LED package operated from a 6V signal. Both these can be formed on different submounts, such as those made of alumina. Other embodiments can comprise 4 LED chips in series that are arranged to operate from 12V. These embodiments can be on submounts made of different material such as aluminum nitride (AlN) or sapphire ($Al_2O_3$). Still other embodiments can comprise four LEDs emitting the same color (e.g. red) and coupled two parallel strings of two LEDs in series. These embodiments can be arranged to operate from a 6 v signal and can be on submounts such as alumina.

Figure 36:
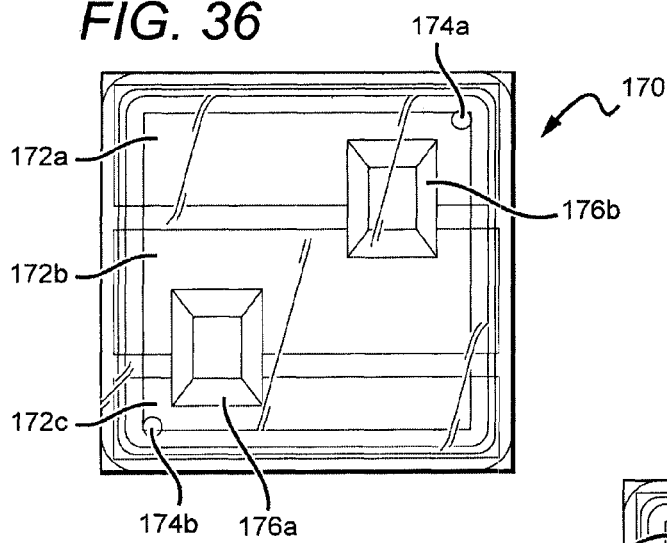
FIG. 36 is a top view of one embodiment of a submount according to the present invention.

FIG. 36 shows one embodiment of a submount 170 according to the present invention with first, second and third die attach pads 172a, 172b, 172c, first and second conductive vias 174a, 174b, and first and second LEDs 176a, 176b. Many different commercially available LEDs can be used such as the DA350 LED chip described above. In this embodiment, the first attach pad 172a is connected to the first conductive via 174a, and the third die attach pad 172c is connected to the second conductive vias 174b. The second die attach pad 172b is not connected to a vias. The the first LED 176a is mounted across the first and second attach pads 172a, 172b, and the second LED 176b is connected across the second and third die attach pads 172b, 172c. This results in a series connection of the first and second LEDs 176a, 176b, with an electrical signal on the first vias 174a conducting into the first die attach pad 172a, then through the first LED 176a, then into the second die attach pad 172b, then through the second LED 176b, and finally into the third die attach pad 172c. Using 3 volt LEDs, this embodiment can utilize a 6 volt drive signal, but the drive voltage can be different depending on the LED voltage.

Figure 37:
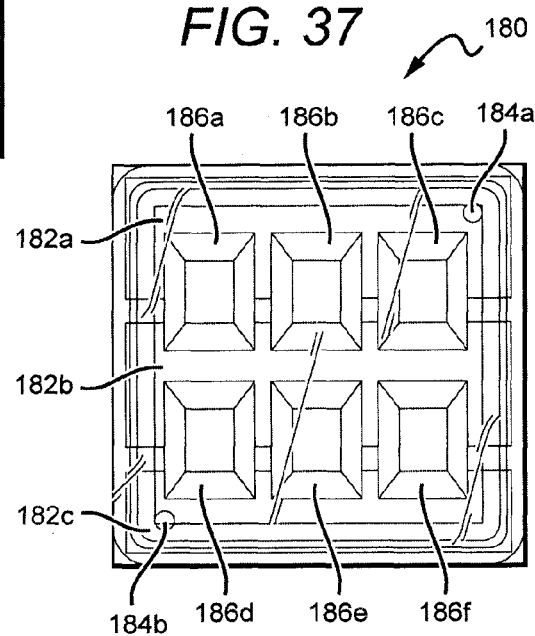
FIG. 37 is a top view of one embodiment of a submount according to the present invention.

FIG. 37 shows another embodiment a submount 180 that is similar to the submount 170 shown in FIG. 36 and comprises first, second and third die attach pads 182a, 182b, 182c, first and second conductive vias 184a, 184b, and first through sixth LEDs 186a, 186b, 186c, 186d, 186e, 186f. The first through third LEDs 186a, 186b, 186c are mounted across the first and second attach pads 182a, 182b, and the fourth through sixth LEDs 186d, 186e, 186f are mounted across the second and third die attach pads 182b, 182c. This results in a series/parallel connection of the LEDs with the first group of first through third LEDs 186a, 186b, 186c connected in parallel the second group of fourth through sixth LEDs 186d, 186e, 186f also mounted in parallel. The first and second groups are connected in series. An electrical signal on the first vias 184a conducting into the first die attach pad 182a, then through the first group, then into the second die attach pad 182b, then through the second group, and finally into the third die attach pad 172c. Using 3 volt LEDs, this embodiment can utilize a 6 volt drive signal, but this can be different as mentioned above.

Figure 38:
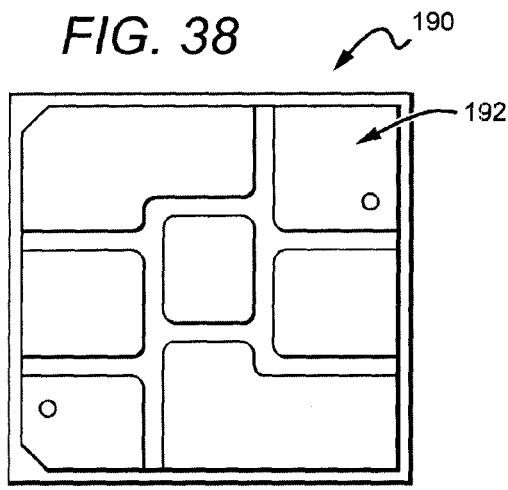
FIG. 38 is a top view of another submount according to the present invention.
Figure 39:
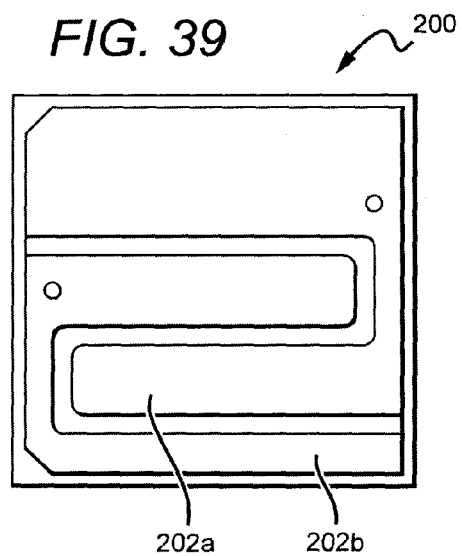
FIG. 39 is a top view of another submount according to the present invention.

FIG. 38 shows still another embodiment of and submount 190 having a die attach pattern 192 that can be used to connect up to six LEDs (not shown) in series, with each of the LEDs being mounted across the space between adjacent elements of the pattern 192. This embodiment can have a drive signal of up to approximately 18 volts for 3 volt LEDs. This drive signal can be less for LED packages having fewer than six LEDs or when using lower voltage LEDs, and can be more if using higher voltage LEDs. FIG. 39 shows another embodiment of an submount 200 having first and second interdigitated U shaped die attach pads 202*a*, 202*b* that are arranged for the mounting of up to 6 LEDs, although the submount can also hold fewer LEDs. Each of the LEDs is mounted across the space between the first and second attach pads 202*a*, 202*b* so that the LEDs are connected in parallel such that a drive signal of 3 volts can be used. Like above, this drive signal can be higher or lower depending on voltage for the particular LED being used. The embodiments in FIGS. 38 and 39 can use different LEDs such as DA350 LEDs described above. In this arrangement on a LED package with a footprint of 1.6 mm by 1.6 mm, the chip area to footprint ratio can be below 3 and in some embodiments approximately 2.59.

Figure 40:
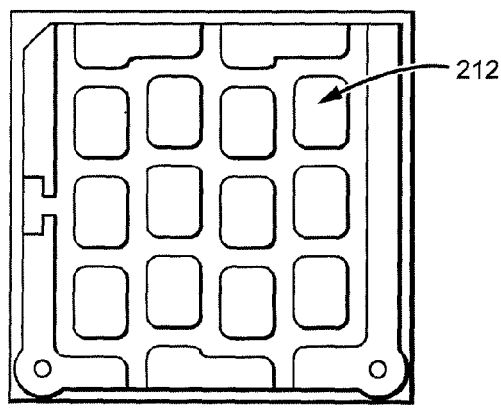
FIG. 40 is a top view of another submount according to the present invention.
Figure 41:
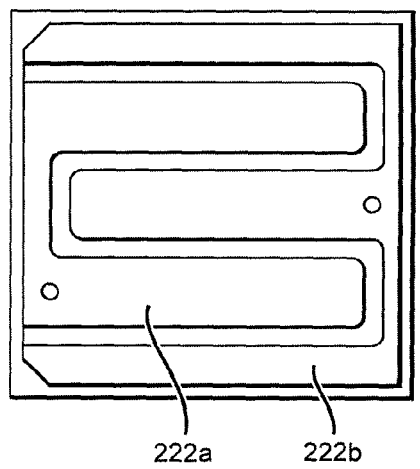
FIG. 41 is a top view of still another submount according to the present invention.

Other embodiments can be arranged to hold even more LEDs. FIG. 40 shows still another embodiment of and submount 210 having a die attach pattern 212 that can be used to connect up to sixteen LEDs (not shown) in series, with each of the LEDs being mounted across the space between adjacent elements of the pattern 192. In embodiments utilizing 3 volt LEDs, a 48 volt drive signal can be used. Like above, this driver signal can be higher or lower, depending on the voltage and number of LEDs mounted to the submount. FIG. 41 shows still another embodiment of an submount 220 comprising a first U-shaped attach pad 222*a*, interdigitated with a second W-shaped attach pad 222*b* such that up to 16 LEDs can be connected in parallel. As with the embodiment above, each of the LEDs can be mounted across the space between the first and second attach pads 222*a*, 222*b*. Using 3 volt devices, this package can utilize a 3 volt drive signal, with this signal being higher or lower as discussed above. The embodiments in FIGS. 40 and 41 can use different LEDs as described above. The embodiment shown is particularly arranged for using DA240 LEDs commercially available from Cree that have an area of 240 μm by 320 μm. In a package with a 1.6 mm by 1.6 mm footprint, the chip area to package footprint ratio can be approximately 2.13, but it is understood that the ratios mentioned herein could be different depending on a number of factors, such as the size of the LEDs, the number of LEDs, size of the submount, etc.

It is noted that the LED in multiple LED package embodiments, it may be advantageous to place the LEDs as close as possible to the edge of the submount. This may be particularly true when using the LED packages in a linear arrangement such as in a LED based fluorescent lighting tube arrangement. For example, for the two LED embodiments described herein, it may be advantageous to place the LEDs at opposing corners on the submount.

Figure 42:
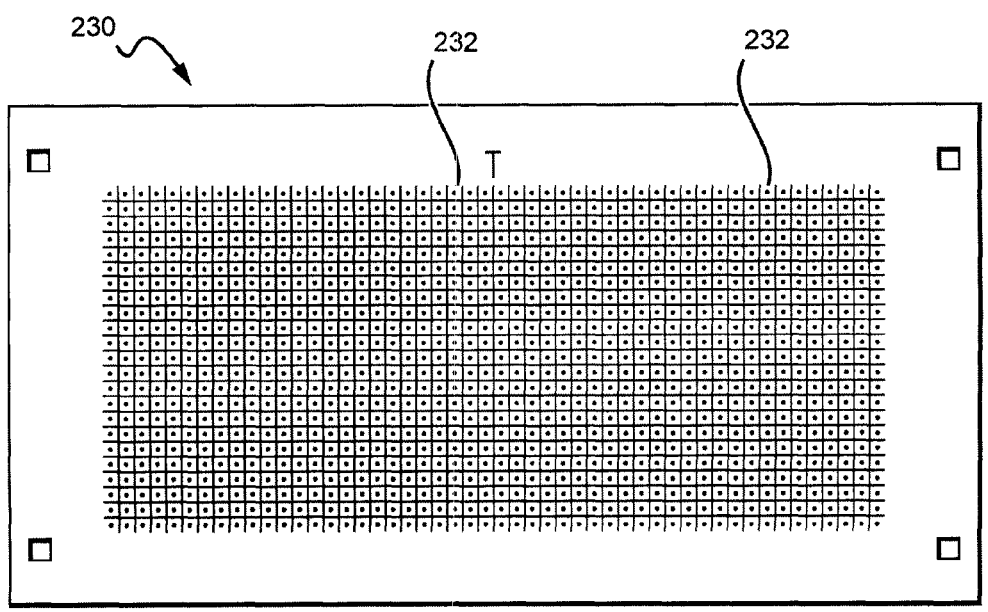
FIG. 42 is a top view of one embodiment of encapsulant mold according to the present invention.

As mentioned above, the encapsulant can be formed in the LED packages according to the present invention using different methods, with some embodiments using different molding processes. One such molding process is referred to as compression molding wherein a mold is provided having a plurality of cavities each of which has an inverted shape of the lens. FIG. 42 shows one embodiment of a mold 230 with a plurality of cavities 232. During molding of the lenses, a submount panel is provided that can have an area approximately the same as that covered by the cavities 232. It is understood that submounts covering less than all the cavities can also be used. The submount panel can comprise a plurality of LEDs (or sets of multiple LEDs) and each of the cavities 232 is arranged to align with a respective one of the LEDs (or a set of LEDs) on the submount panel. The mold is loaded with an encapsulant material in liquid form filling the cavities, with some embodiments utilizing a liquid curable silicone. The submount panel can be moved toward the cavity with each of the LEDs (or set of LEDs) being embedded in the liquid silicone within one of the respective cavities. The liquid silicone can then be cured using known curing processes. The panel can then be removed from the mold and the panel can comprise a plurality of encapsulants in the shape of the cavities, each of which is over a respective one of the LEDs. The individual LED packages can then be separated or singulated from the submount panel, using known techniques.

Referring again to the embodiment described above, and in particular the LED package 150 shown in FIGS. 4 through 13, a small encapsulant connection section 69 is provided at the base of the encapsulant 58. This is a byproduct of the molding process. The cavities in the molding process may not extend to the top surface of the submount 54, thereby leaving the encapsulant section between adjacent ones of the LED packages. The singulation process cuts through the connection section 69 and the submount 54 when separating the LED packages.

It is understood that other fabrication processes can be used with one such process comprising covering of a submount panel and its LEDs with a layer of encapsulant material. The individual LED packages can then be separated by different methods such as dicing or cutting through the encapsulant and submount. The resulting packages can have encapsulant side surfaces that are approximately vertical and aligned with the edges of the submount. In still other embodiments, the encapsulants can be separately molded and then attached to the submount over phosphor conversion material layer. It is understood that the surfaces of the encapsulants can be smoothed or further shaped using different methods, such a cutting, grinding, sanding or etching.

As mentioned above, embodiments according to the present invention can have relatively smooth planar surfaces to enhance TIR. The surfaces should be smooth enough such that the LED is clearly visible through the encapsulant. Stated differently, there is little or no roughness on the surface of the encapsulant to obscure or redirect the light rays passing through the encapsulant. In some embodiments where there is some texturing, roughness or imperfections on the surfaces of the encapsulant, either intentionally included or the result of manufacturing processes. For these embodiments, it can be preferable that these surface features be of the size that does not significantly scatter light. In some embodiments, surface features of sizes having a root mean square (RMS) close to or greater than the wavelength of light encountering the surface. Feature sizes having an RMS greater than the wavelength of light tend to scatter less light, while feature sizes having an RMS less than the wavelength of light tend to scatter more of the light. For embodiments where blue light encounters the surface, the surface features can have an RMS of or greater than approximately 500 nanometers, to minimize scattering. This RMS value can change depending on the wavelength of light encountering the encapsulant surface.

Figure 43:
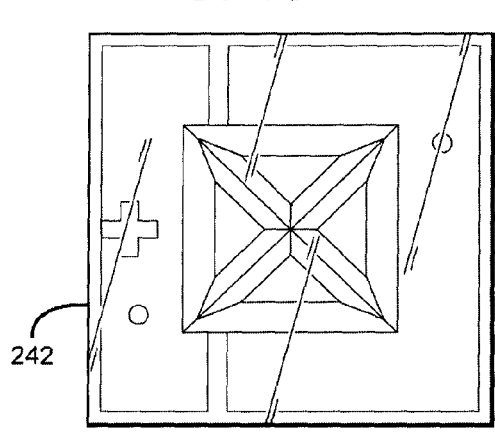
FIG. 43 is a top view of still another embodiment of an LED package according to the present invention.
Figure 44:
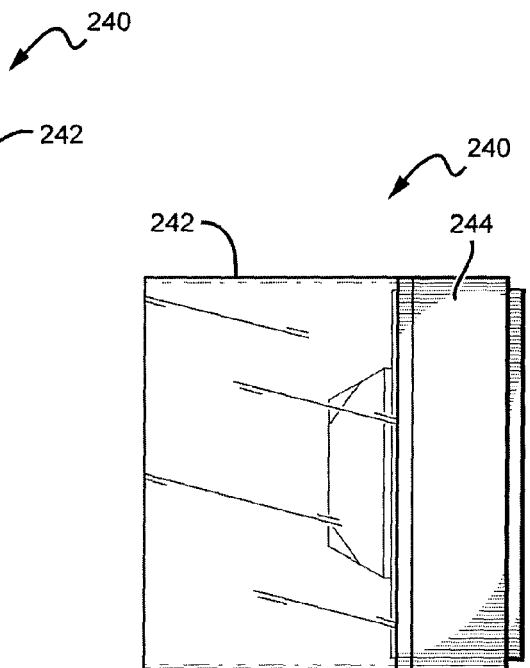
FIG. 44 is a side view of the LED package shown in 43.
Figure 45:
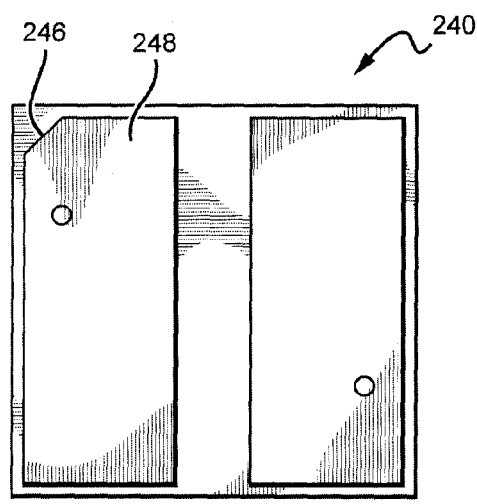
FIG. 45 is a bottom view of the LED package shown in FIG. 43.
Figure 46:
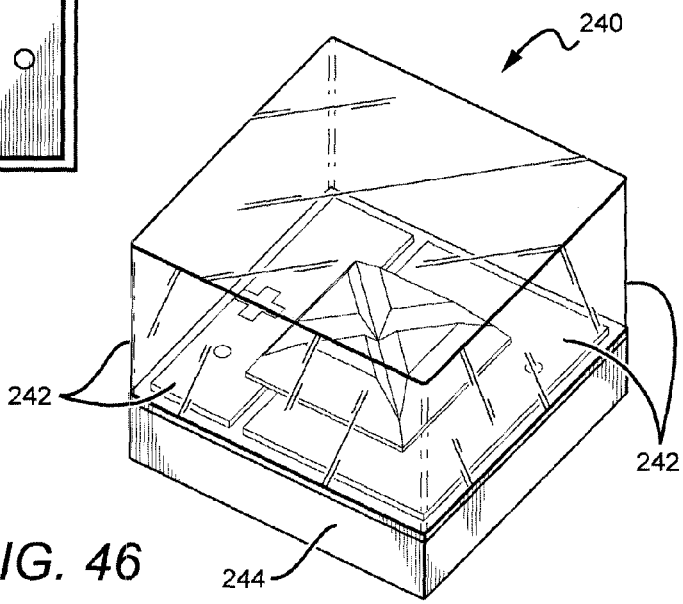
FIG. 46 is a perspective view of the LED package shown in FIG. 43.

FIGS. 43 though 46 show another embodiment of an LED package 240 according to the present invention having approximately vertical side surfaces 242 that are approximately aligned with the edges of the submount 244. This embodiment also has a polarity indicator that comprises a notch 246 in the corner of the solder pad 248. Again, this is only one of the many different types of polarity indicators that can be included in the embodiments of the present invention.

The embodiments above have been described with reference to certain embodiments arranged in different ways, but it is understood that different features described above can be utilized in different packages arranged in different ways. For example, the features above can be used in packages similar to those commercially available from Cree, Inc., including but not limited to the XLampCX, XLampM and XLampX family of LED packages.

The LED packages described above can be used in many different lighting applications using a single LED package or multiple LED packages. The package can serve as the light source for lamps such as those described in U.S. patent application Ser. No. 13/034,501, to Le et al., entitled "Solid State Lamp", and U.S. patent application Ser. No. 13/028,946, to Le et al., entitled "High Efficacy LED Lamp With Remote Phosphor and Diffuser Configuration", both incorporated herein by reference.

The LED packages can also be used in troffer type lamp fixtures such as those described in U.S. patent application Ser. No. 13/368,217 to Pickard et al., entitled "Multiple Panel Troffer Style Light Fixture", and U.S. patent application Ser. No. 12/873,303, Edmond et al., entitled "Troffer-Style Fixture", both incorporated herein by reference.

Figure 47:
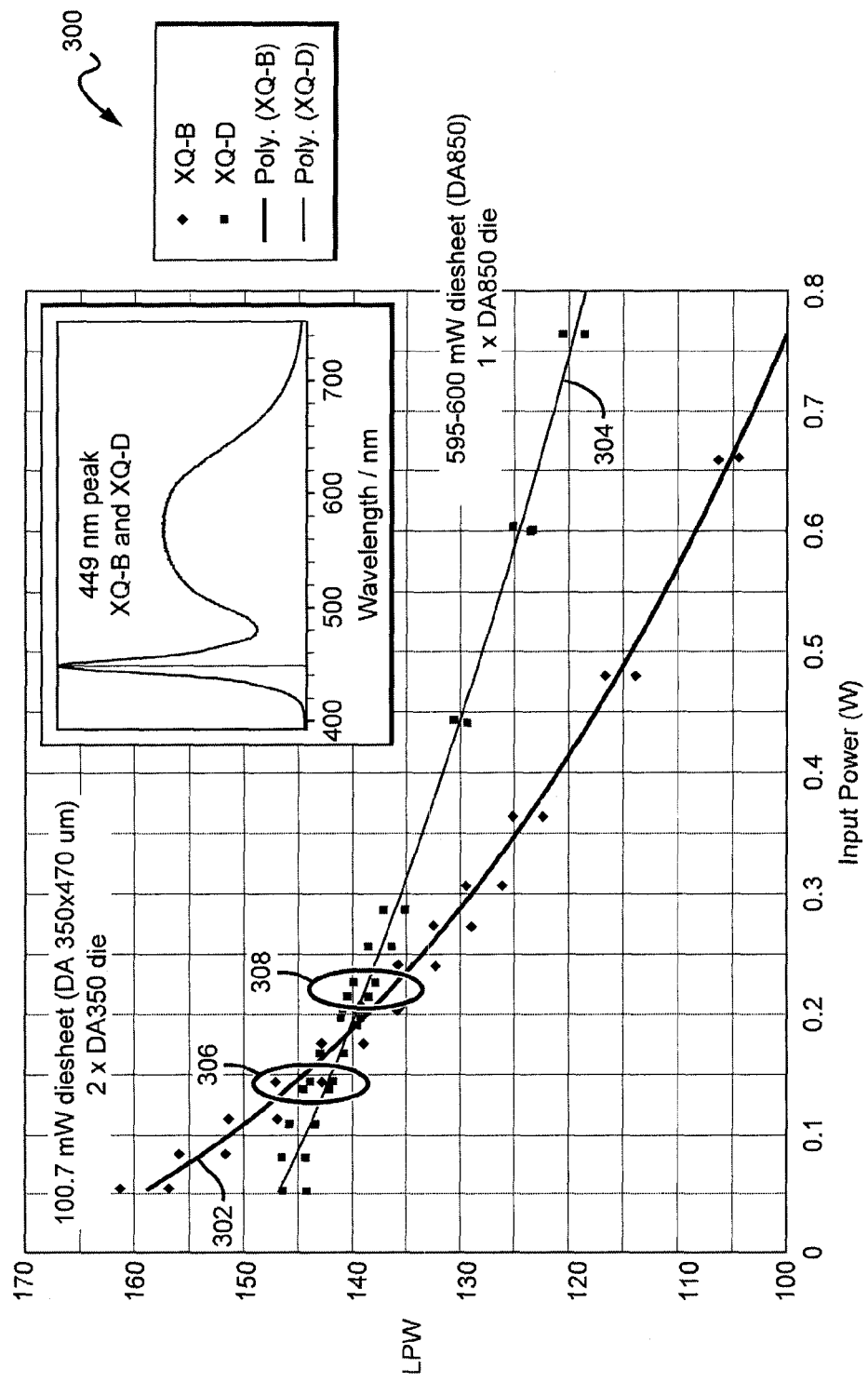
FIG. 47 is a graph showing performance characteristics for LED based fluorescent replacement tubes according to the present invention.
Figure 48:
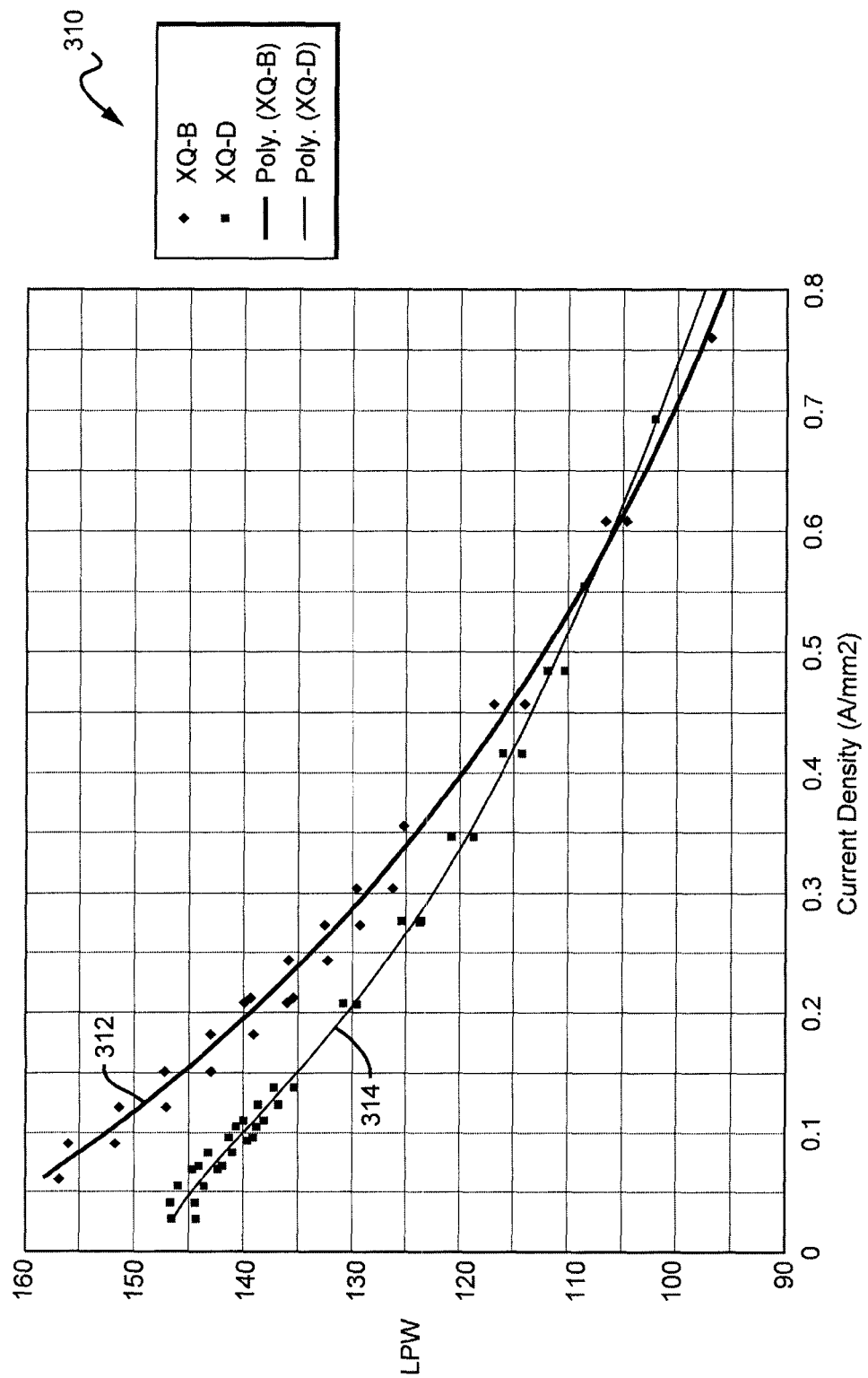
FIG. 48 is another graph showing performance characteristics for LED based fluorescent replacement tubes according to the present invention.

The LED packages can also be used in many other lighting applications such as LED displays, LED street lighting, residential LED downlighting, etc. Some LED package embodiments of the present invention are particularly applicable to fluorescent tube replacement LED lighting with the emission pattern of the LED packages being desirable for linear arrays such as those used in fluorescent tube replacements. FIG. 47 is graph 300 showing the first and second plots 302, 304 with the first plot 302 showing performance (lumens per watt verses input power) of LED package embodiments according to the present invention that have 2 LEDs and whose emission pattern can be desirable for fluorescent replacement tubes. The LED package can include many different LEDs with some embodiments comprising two DA350 LEDs as described above. The second plot 304 shows performance (lumens per watt verses input power) of a second LED package according to the present invention that have a single LED and whose emission pattern may also be desirable. Many different single LEDs can be used, such as one DA850 as described above. The first and second highlighted portions 306, 308 show operating performance for these devices as might be found in 21 watt and a 31 watt: fluorescent replacement tube operation, respectively. FIG. 48 is a graph 310 also showing first and second plots 312, 314, with plot 312 showing additional performance (lumens per watt verses current density) data for a the first LED package, and plot 314 showing the performance data for the second LED package.

The LED packages can be arranged with many different features beyond those described above. Some embodiments can comprise electrostatic discharge (ESD) protection elements or devices. Others of the LED packages can be arranged with secondary optics to further shape the package beam profile.

Although the embodiments above are described herein with reference to LED packages with conversion material layers, it is understood that other embodiments can be provided without a conversion material layer. Some of these embodiments can comprise an encapsulant with one or more planar surfaces along with a blue, red or green LED chip by itself to provide LED packages emitting blue, red or green light. Other embodiments can also comprise multiple LED chips emitting different colors of light such as red, green or blue emitting LEDs, or red green, blue and white emitting LEDs. These are only some of the combinations that are possible in different embodiments according to the present invention.

The LED packages can be arranged with many additional features, such as adaptors or connectors to allow for handing and mounting of these relatively small packages. The different LED package embodiments can comprise different markings or other features to assist in alignment, or the mounting area can have marks or features to assist in alignment and mounting of the LED packages.

Although the present invention has been described in detail with reference to certain preferred configurations thereof, other versions are possible. The invention can be used in any light fixtures where a uniform light or a near uniform light source is required. In other embodiments, the light intensity distribution of the LED module can be tailored to the particular fixture to produce the desired fixture emission pattern. Therefore, the spirit and scope of the invention should not be limited to the versions described above.

We claim:

1. A lighting package, comprising:
    a solid state light source on a submount;
    a wavelength conversion material layer covering said solid state light source and the top surface of said submount;
    an encapsulant over said conversion material layer, said encapsulant having one or more planar surfaces, wherein said planar surfaces cause total internal reflection (TIR) of at least some light from said light source.

2. The lighting package of claim 1, wherein said solid state light source comprises one or more light emitting diodes (LEDs).

3. The lighting package of claim 1, wherein said solid state light source comprises one or more solid state lasers.

4. The lighting package of claim 1, wherein said encapsulant comprises a planar top surface and planar side surfaces.

5. The lighting package of claim 1, wherein said encapsulant comprises a horizontal planar surface and vertical planar surface.

6. The lighting package of claim 1, further comprising two or more solder pads on the backside of said submount.

7. The lighting package of claim 1, wherein said light source comprises a single LED.

8. The lighting package of claim 1, wherein said light source comprising multiple LED chips.

9. The lighting package of claim 8, wherein said LED chips are connected in series.

10. The lighting package of claim 8, wherein at least some of said LED chips are connected in parallel.

11. The lighting package of claim 8, wherein said LED chips are connected in a series and parallel combination.

12. The lighting package of claim 1, wherein said encapsulant comprises a flat top and vertical sidewalls with planar surfaces.

13. The lighting package of claim 1, wherein said encapsulant shape is from the group comprising cubic, prismatic, cylindrical, triangle, pentagon, hexagon and octagon.

14. The lighting package of claim 1, wherein said encapsulant comprises a horizontal surface and vertical surfaces numbering in the range of 3 to 12.

15. The lighting package of claim 1, comprising an emission pattern greater than 120° full width at half maximum.

16. The lighting package of claim 1, wherein said one or more planar surfaces comprise features having a root mean square (RMS) size greater than the wavelength of light emitting from said LED light source.

17. The lighting package of claim 1, further comprising a polarity indicator.

18. The lighting package of claim 17, wherein the polarity indicator is on the top or bottom surface of said submount, or both.

19. The lighting package of claim 1, having an emission profile that is wider than a package with identical features aside from an encapsulant not having planar surfaces.

20. The lighting package of claim 1, having a submount footprint area of less than 12 mm square.

21. The lighting package of claim 1, wherein the ratio of the footprint of said submount to the footprint of said one or more LEDs is in the range of just over 1 to approximately 20.

22. The lighting package of claim 1, wherein the ratio of the footprint of said submount to the footprint of said one or more LEDs is in the range of about 2.5.

23. The lighting package of claim 1, wherein said submount has a footprint ratio of approximately 1 by 1, with a corresponding height ratio in the range of approximately 0.5 to 5.

24. The lighting package of claim 1, wherein said light source comprises one or more LEDs, further comprising a plurality of die attach pads on said submount and below said encapsulant, said one or more LEDs mounted to said die attach pads.

25. The lighting package of claim 24, wherein said one or more LEDs comprise a plurality of LEDs chip mounted to said die attach pads in series.

26. The lighting package of claim 24, wherein said LEDs chip are mounted to said die attach pads in parallel.

27. The lighting package of claim 24, wherein said LED light source comprises a plurality of LED chips mounted to said die attach pads in a series and parallel combination.

28. The lighting package of claim 1, wherein said solid state light source comprises a violet to UV emitting light source.

29. The lighting package of claim 28, wherein said wavelength conversion material layer converts at least some of said violet to UV light to blue and/or yellow light.

30. The lighting package of claim 28, wherein said wavelength conversion material layer comprises a combination of red, green and blue phosphors.

31. An emitter package, comprising:
a solid state light source on a submount;
a encapsulant on said submount, said encapsulant having one or more planar surfaces; and
a wavelength conversion material layer covering said solid state light source and the top surface of said submount;
a polarity indicator on the bottom surface of said submount.

32. The emitter package of claim 31, wherein said solid state light source is selected from the group consisting of an LED and a laser.

33. The emitter package of claim 32, wherein said polarity indicators are visible by cameras in solid state manufacturing equipment.

34. The emitter package of claim 32, further comprising one or more contact pads on said submount.

35. The emitter package of claim 32, wherein said polarity indicator is in or on one of said contact pads.

36. The emitter package of claim 32, wherein said polarity indicator near the middle of one of the edges of one of said contact pads.

37. The emitter package of claim 32, wherein said polarity indictor is at the corner of one of said contact pads.

38. The emitter package of claim 32, wherein said polarity indicator comprises a notch.

39. The emitter package of claim 32, wherein said notch has a shape from the group comprising V-shaped, U-shaped, I-shaped, W-shaped, square shaped, rectangular shaped, plus shaped, minus shaped, and star shaped.

40. The emitter package of claim 32, wherein said polarity indicator is arranged such that it is visible through holes in LED carrier tape.

41. The emitter package of claim 32, further comprising one or more die attach pads.

42. The emitter package of claim 41, wherein said polarity indicator is in or one of said die attach pads.

43. The emitter package of claim 41, wherein said polarity indictor is along the edge of one of said die attach pads.

44. The emitter package of claim 41, wherein said polarity indicator comprises a notch.

45. The emitter package of claim 41, wherein said polarity indicator has a shape from the group comprising V-shaped, U-shaped, I-shaped, W-shaped, square shaped, rectangular shaped, plus shaped, minus shaped, and star shaped.

46. An emitter package, comprising:
a solid state light source on a submount;
an encapsulant on said submount, said encapsulant having one or more planar surfaces, wherein said package emits an emission profile that is wider than a package with identical features aside from a encapsulant not having planar surfaces.

47. The emitter package of claim 46, wherein said solid state light source is selected from the group consisting of an LED and a laser.

48. The emitter package of claim 47, wherein said encapsulant is cube shaped.

49. The emitter package of claim 47, wherein said package emits an emission profile that is wider than a similar package with a hemispheric encapsulant.

50. The emitter package of claim 47, wherein said emission profile exceeds 120 degrees full width at half maximum (FWHM).

51. The emitter package of claim 47, wherein said emission profile exceeds 130 degrees full width at half maximum (FWHM).

52. The emitter package of claim 47, wherein said emission profile is in the range of 130 to 170 degrees full width at half maximum (FWMH).

53. The emitter package of claim 47, wherein said emission profile is in the range of 130 to 160 degrees full width at half maximum (FWMH).

54. The emitter package of claim 47, wherein said emission profile is in the range of 130 to 150 degrees full width at half maximum (FWMH).

55. The emitter package of claim 47, wherein said emission profile is approximately 150 degrees full width half maximum (FWHM).

56. The emitter package of claim 47, emitting light with substantially the same efficiency as a similar package with an encapsulant not having planar surfaces.

57. The emitter package of claim 47, emitting light with variations in color temperature of less than −300 to +300 Kelvin in a viewing angle range of approximately −100 to +100 degrees.

58. The emitter package of claim 47, emitting light with variations in color temperature of less than −400 to +400 Kelvin and in a viewing angle range of approximately −100 to +100 degrees.

59. The emitter package of claim 47, emitting light with variations in color temperature of less than approximately −200 to +200 Kelvin and in a viewing angle range of approximately −100 to +100 degrees.

60. The emitter package of claim 47, further comprising a blanket conversion material on said submount and below said encapsulant.

61. An emitter package, comprising:
a solid state light source on a submount;
an encapsulant on said submount, said encapsulant having one or more planar surfaces, a wavelength conversion material layer covering said solid state light source and the top surface of said submount;
wherein said submount has a footprint area of less than 12 mm square per 1 mm square light source area, wherein said encapsulant is cube shaped.

62. The emitter package of claim 61, wherein said solid state light source is selected from the group consisting of an LED and a laser.

63. The emitter package of claim 62, further comprising a blanket conversion material on said submount and below said encapsulant.

64. The emitter package of claim 62, wherein said footprint has an area of less than approximately 9 mm square per 1 mm square light source area.

65. The emitter package of claim 62, wherein said footprint has an area of less than approximately 6 mm square per 1 mm square light source area.

66. The emitter package of claim 62, wherein said footprint has an area of less than approximately 4 mm square per 1 mm square light source area.

67. The emitter package of claim 62, wherein said footprint has an area in the range of 1 to 4 mm square per 1 mm square light source area.

68. The emitter package of claim 62, wherein said footprint is approximately 2.56 mm square.

69. An emitter package, comprising:
one or more solid state light sources on a submount; and
an encapsulant on said submount, said encapsulant having one or more planar surfaces,
a wavelength conversion material layer covering said one or more solid state light sources and the top surface of said submount;
wherein the ratio of the footprint of said submount to the footprint of said one or more solid state light sources is in the range of just over 1 to approximately 20.

70. The emitter package of claim 69, wherein said one or more solid state light sources are selected from the group consisting of LEDs, lasers and a combination thereof.

71. The emitter package of claim 70, wherein said ratio is in the range of just over 1 to approximately 3.

72. The emitter package of claim 70, wherein said ratio is in the range of just over 1 to approximately 2.

73. The emitter package of claim 70, wherein said ratio is in the range of just over 1 to approximately 15.

74. The emitter package of claim 70, wherein said ratio is in the range of just over 1 to approximately 10.

75. The emitter package of claim 70, wherein said ratio is in the range of just over 1 to approximately 5.

76. An emitter package, comprising:
one or more solid state light sources on a submount; and
a transparent encapsulant on said submount, said encapsulant having one or more planar surfaces,
a wavelength conversion material layer covering said solid state light source and the top surface of said submount;
wherein said submount has a footprint ratio of approximately 1 by 1, with a corresponding height ratio in the range of approximately 0.5 to 5.

77. The emitter package of claim 76, wherein said one or more solid state light sources are selected from the group consisting of LEDs, lasers and a combination thereof.

78. The emitter package of claim 77, wherein said encapsulant has a height in the range of approximately 0.3 mm to 5 mm.

79. The emitter package of claim 77, emitting a wider emission pattern with higher encapsulants.

80. The emitter package of claim 77, wherein said footprint ratio is approximately 1 by 1, with a corresponding height ratio in the range of approximately 0.5 to 2.

81. The emitter package of claim 77, wherein said footprint ratio is approximately 1 by 1, with a corresponding height ratio in the range of approximately 0.5 to 1.5.

82. The emitter package of claim 77, wherein said footprint to height ratios are approximately of 1 by 1 by approximately 1.5 or greater.

83. The emitter package of claim 77, wherein said footprint to height ratios are approximately of 1 by 1 by approximately 2 or greater.

84. The emitter package of claim 77, wherein said footprint to height ratios are approximately of 1 by 1 by approximately 3 or greater.

85. The emitter package of claim 77, wherein said encapsulant has a height in the range of approximately 0.3 mm to 5 mm.

86. The emitter package of claim 77, wherein said encapsulant has a height in the range of approximately 0.3 mm to 2 mm.

87. A solid state luminaire, comprising:
a solid state light source with one or more light emitting diode (LED) packages, comprising:
an LED light source on a submount;
a blanket conversion material layer on said submount;
an encapsulant over said conversion material layer, said encapsulant having one or more planar surfaces, wherein said planar surfaces cause total internal reflection (TIR) of at least some light from said light source.

88. The luminaire of claim 87, comprising a light bulb.

89. The luminaire of claim 87, comprising a troffer.

90. The luminaire of claim 87, comprising a street lamp.

91. The luminaire of claim 87, wherein said encapsulant is cube shaped.

* * * * *